United States Patent [19]

Kazami et al.

[11] Patent Number: 5,285,107
[45] Date of Patent: Feb. 8, 1994

[54] HYBRID INTEGRATED CIRCUIT DEVICE

[75] Inventors: Akira Kazami, Ashikaga; Osamu Nakamoto, Ohta; Hisashi Shimizu, Ohta; Katsumi Ohkawa, Ohta; Yasuhiro Koike, Gunma; Koji Nagahama, Ohta; Masao Kaneko, Maebashi; Masakazu Ueno, Ohta; Yasuo Saitou, Gunma, all of Japan

[73] Assignee: Sanyo Electric Co., Ltd., Osaka, Japan

[21] Appl. No.: 510,467

[22] Filed: Apr. 18, 1990

[30] Foreign Application Priority Data

| Apr. 20, 1989 | [JP] | Japan | 1-100785 |
| Apr. 20, 1989 | [JP] | Japan | 1-100786 |
| May 12, 1989 | [JP] | Japan | 1-119109 |
| May 12, 1989 | [JP] | Japan | 1-119110 |
| May 12, 1989 | [JP] | Japan | 1-119113 |
| May 15, 1989 | [JP] | Japan | 1-120901 |
| May 15, 1989 | [JP] | Japan | 1-120906 |
| May 16, 1989 | [JP] | Japan | 1-122356 |
| May 16, 1989 | [JP] | Japan | 1-122357 |
| May 17, 1989 | [JP] | Japan | 1-123903 |
| May 17, 1989 | [JP] | Japan | 1-123904 |
| May 18, 1989 | [JP] | Japan | 1-124912 |
| May 18, 1989 | [JP] | Japan | 1-124913 |
| May 19, 1989 | [JP] | Japan | 1-127310 |

[51] Int. Cl.⁵ .................... A01L 23/02; A01L 23/12
[52] U.S. Cl. .................... 257/680; 257/678; 257/681; 257/723; 257/724
[58] Field of Search ............ 357/74, 72, 75, 79, 357/80; 257/668, 678, 684, 687, 693, 681, 680, 685, 666, 703, 704, 723, 724, 798, 725

[56] References Cited

U.S. PATENT DOCUMENTS

| 3,614,832 | 10/1971 | Chance et al. | 357/75 |
| 4,727,221 | 2/1988 | Saitou et al. | 357/72 |
| 4,972,253 | 11/1990 | Palino et al. | 357/74 |
| 5,016,138 | 5/1991 | Woodman | 357/80 |

FOREIGN PATENT DOCUMENTS

| 2630859 | 11/1989 | France | 357/75 |
| 0180463 | 8/1986 | Japan | 357/75 |

Primary Examiner—Andrew J. James
Assistant Examiner—Carl Whitehead, Jr.
Attorney, Agent, or Firm—Spensley Horn Jubas & Lubitz

[57] ABSTRACT

A hybrid integrated circuit device is provided with: a microcomputer, a plurality of peripheral circuit elements, and a non-volatile memory which is positioned adjacent to the microcomputer, all of which are interconnected by a plurality of specified conductive paths; pair of integrated circuit substrates on which is formed the conductive paths and a casing provided with the pair of integrated circuit substrates secured to the upper and lower surfaces of the casing, forming a sealed space between these surfaces. The microcomputer and the peripheral circuit elements are positioned in the sealed space and only the non-volatile memory is positioned in an exposed space. The hybrid integrated circuit device of the present invention has a compact and simple form with a high degree of mounting density as well as superior handling capabilities and reliability.

17 Claims, 20 Drawing Sheets

HYBRID INTEGRATED CIRCUIT DEVICE

BACKGROUND OF THE INVENTION

1. Field of the Invention

The present invention relates to a hybrid integrated circuit device with a built-in microcomputer and, in particular, to a hybrid integrated circuit device provided with a non-volatile memory which feeds data to the microcomputer, and which can be treated as an electronic part which functions independently.

2. Description of the Background Art

An EPROM element with an ultraviolet light irradiation window provided in its surface by which it is possible to erase stored data written on a chip by ultraviolet irradiation and to rewrite into that memory is preferably used in various types of electronic devices. Usually, these EPROM elements are detachably mounted on a printed board for subsequent rewriting. Most of these EPROMs are mounted together with a control- or drive-integrated circuit on a printed board. For electronic devices which must be small and light-weight, a technique known as "chip-on-board" is adopted, wherein a semiconductor integrated circuit (IC) chip is directly mounted on a printed board, and after the required wiring is implemented, the IC chip and the wiring section are covered with a synthetic resin. However, in an electronic device for which an EPROM element is required, because it must be possible to erase the stored data by directing ultraviolet light onto the EPROM element, and to rewrite into the element, the chip-on-board technique whereby an EPROM chip is mounted directly on a printed board and covered with a synthetic resin cannot be adopted. For this reason, in an electronic device for which an EPROM element is required, there is no other choice but to use an EPROM element incorporated in a SADIP-type package. This is an obstacle to an small-size, light-weight unit.

FIG. 1 is a perspective view of an EPROM substrate, which explains the mounting structure of a conventional EPROM element. One part of an EPROM element 74 is shown in section.

A plurality of through-hole terminals 73 and a plurality of male connector terminals 85 made of a conductive material as well as a conductive wire pattern 71 connecting these terminals are formed on the main surface of an insulating substrate 72 made from glass-epoxy resin or other similar material. An external conductive lead 78 of the EPROM element 74 incorporated into a SADIP-type package is inserted through and electrically connected by soldering to the through-hole terminal 73, and is mechanically secured to the insulated substrate 72.

The EPROM element 74 is provided with a ceramic header 75 and a ceramic cap 76. The external conductive lead 78 is bonded to the header 75 using a glass material with a low melting point. An element mounting section 80 which is produced from a sintered gold paste made up of a large quantity of gold powder mixed with glass is also bonded directly to the header 75, or indirectly to the header 75 through the low melting point glass material which is extended to the element mounting section 80. An EPROM chip 81 with an ultraviolet emitting surface on the top is mounted on the element mounting section 80. An electrode of the chip 81 is connected to the external conductive lead 78 with a fine metal wire 82. The cap 76 is a cover member provided with a window 83 vis-a-vis the ultraviolet emitting surface of the EPROM chip 81. The cap 76 is bonded to the header 75 using a low melting point glass, and seals the EPROM chip 71 which is positioned on the header 75. The EPROM substrate having the above structure is formed independently of the main circuit print board. The EPROM element 74 is connected to a microcomputer or the like mounted on the main circuit print board. This connection is made through the external conductive lead 78, the through hole terminal 73, the conductive wire pattern 71, a male connector terminal section 85, and a female connector (omitted from the drawings).

The external form of a package when such a conventional EPROM element mounting method is used is extremely large relative to the EPROM chip 81. In addition to a large plan area, the height of the elements is also several times the height of the chip. This is a severe handicap in providing a thin printed board. After the external conductive lead is inserted into the through hole terminal 73, the EPROM element must be secured by solder or the like. In addition, a particularly troublesome drawback is the fact that, before mounting on the insulated substrate, the EPROM element must once be assembled in the package. Because the EPROM element is provided with an ultraviolet emitting window, the package is assembled in a SADIP-type package made from a ceramic and, because this package is sealed using low melting point glass, a high temperature (400° C. to 500° C.) sealing process must be adopted. If the electrode (aluminum) of the EPROM chip and the fine metal wire which connects the electrodes (aluminum) of the EPROM chip to the external conductive lead are not made from the same type of material, an alloy is produced at the sealed section during the high temperature sealing process and the resistance of the wire increases. This can cause the wire to break. A fine aluminum wire is usually used to avoid this kind of trouble, but, in this EPROM chip, the earth electrode of the EPROM chip is wired to the mounting section of the chip which is formed with gold paste, because the substrate of the EPROM chip must bear earth potential. Here as well, a binary or multiple alloy reaction occurs between the gold in the gold paste and/or the metal in the metal foil or the like, and the aluminum. Because of this, a small silicon leaf covered with aluminum on the head referred to as a gland die, is attached to the chip mounting section formed from the gold paste, and the earth electrode of the EPROM is connected to the top of the gland die. The conventional mounting structure has many drawbacks accompanied by the above complicated process. Thus, the conventional mounting structure does not satisfy any of the requirements for small size, light weight, and low cost.

The EPROM mounting structure shown in FIG. 2 has been proposed to eliminate this type of problem. This mounting structure will now be explained with reference to the drawing.

An insulated substrate 86 made from a glass-epoxy resin or other similar material has a main surface 87 on which is formed a wiring pattern 88. A chip mounting area 89 which supports an EPROM chip 90 is provided on the insulated substrate 86. The wiring pattern 88 is routed on the main surface 87 from a point close to the chip mounting area 89 and is connected to a male connector terminal (omitted from the drawing). The EPROM chip 90 is mounted on the chip mounting area 89. A surface electrode of the EPROM chip 90 is connected to the wiring pattern 88 by a fine metal wire 92. The substrate of the EPROM chip 90 as well is connected to the mounted wiring pattern 88 by one strand of the fine metal wire 92. An ultraviolet transmitting window material 94 of the EPROM chip 90 is fixed on the ultraviolet-emitting surface 91 of the EPROM chip 90 through an ultraviolet transmitting resin 93 [for example, TX-978 (trademark), manufactured by Toray]. The window material 94 is made from a commonly known ultraviolet transmitting material such as quartz, transparent alumina, or the like. The top surface 95 of the window material 94 is a surface which introduces light to the ultraviolet-emitting surface 91 of the EPROM chip 90. The parts of the window material 94 other than the top surface 95, the fine metal wire 92, and the part connecting the fine metal wire 92 with the wiring pattern 88 are covered with a synthetic resin 96 [for example, MP-10 (trademark), manufactured by Nitto Denko Corp.]. If the base of the chip mounting area 89 of the substrate 86 is situated on a concave at about half the height of the substrate 86, it is possible to further reduce the combined thickness of the insulated substrate 86, the EPROM chip 90, and the window material 94, while formation of a floodgate by the synthetic resin 96 effectively prevents moisture from entering. The EPROM mounting structures shown in FIG. 1 and FIG. 2 are disclosed in Japanese Patent Laid-open No. 83393/1985 (H05K 1/18).

Because the EPROM chip is die-bonded to the printed board in the EPROM mounting structure shown in FIG. 2, the printed board is reduced in size by only the amount of reduction of the EPROM. However, because the microcomputer which is to be fixed near the EPROM chip and its peripheral circuit elements (not shown in FIG. 2) are fabricated as discrete electronic parts, the size reduction is hardly achieved, if the printed board on which the EPROM is mounted is viewed as a system. In addition, in the EPROM having the structure illustrated in FIG. 2, rewriting of program data onto the EPROM chip must be performed after the program data has been erased by exposing the printed board to ultraviolet light, by touching a write-in terminal, such as a probe or the like, to the conductive pattern extending from the EPROM chip. This entails a problem that because usual conventional ROM writers cannot be used, troublesome procedures are required for rewriting onto an EPROM.

With the EPROM mounting structure shown in FIG. 1, since the EPROM is detachably mounted on the main printed board, a conventional ROM writer can be used for writing. However, the circuits around the EPROM, i.e. the microcomputer and its peripheral circuit elements, such as LSIs, ICs, and the like, are constructed as discreet electronic parts in the same manner as in FIG. 2. This causes the printed board as well as the total system to be large in size, making it impossible to provide a small and light integrated circuit as the user requires. This is a major problem. In addition, an independent printed board for the EPROM element is required, and the wiring pattern 71 for connecting the EPROM element 74 to a microcomputer becomes very long, bringing about the problem that size reduction cannot be achieved.

With the EPROM mounting structures shown in FIG. 1 and FIG. 2, the complete system becomes large, as outlined above. In addition, because the conductive pattern which connects the EPROM and the peripheral circuit elements are exposed, reliability is lowered.

Furthermore, with the EPROM mounting structures shown in FIG. 1 and FIG. 2, because the EPROM and its peripheral microcomputer and circuit elements, such as LSIs, ICs, and the like are exposed, irregularities are formed on the upper surface of the substrate, reducing operability and making servicing difficult.

SUMMARY OF THE INVENTION

Accordingly, a first object of the present invention is to provide a hybrid integrated circuit device which is provided with a built-in microcomputer and a built-in non-volatile memory which feeds data to the microcomputer, and which functions as an independent electron device.

A second object of the present invention is to provide a built-in non-volatile memory which is capable of rewriting with ease to cope with a wide variety of user specifications or user-specified modifications.

A third object of the present invention is to provide a small, light hybrid integrated circuit device with a built-in non-volatile memory and improved mounting efficiency.

A fourth object of the present invention is to provide a hybrid integrated circuit device with a compact and simple form, which can cope with a wide variety of user specifications with ease and can be treated as a single electron device.

A fifth object of the present invention is to provide a hybrid integrated circuit device with a high degree of integration, in which a peripheral circuit printed board can be reduced or abolished.

A sixth object of the present invention is to provide a hybrid integrated circuit device with a built-in non-volatile memory wherein the data in the non-volatile memory can easily be erased and built-in circuit elements are perfectly sealed.

A seventh object of the present invention is to provide a compact and simple hybrid integrated circuit device which can be treated as a single electron device, wherein commercially available non-volatile memory with an optional structure and shape can be applied.

An eighth object of the present invention is to provide a hybrid integrated circuit device with a non-volatile memory, wherein the non-volatile memory can optionally be positioned and the layout of the integrated circuit substrate of the hybrid integrated circuit device can easily be designed.

Furthermore, the present invention is directed to an integrated circuit substrate structure and a casing structure of a hybrid integrated circuit having excellent heat dissipation capabilities and a high degree of mounting density.

These objects are achieved in the present invention by the provision of a first embodiment comprising:

a pair of integrated circuit substrates provided with a microcomputer and its peripheral circuit elements interconnected by a specified conductive path, a non-volatile memory positioned adjacent to the microcomputer, and conductive paths formed on the pair of integrated circuit substrates and interconnected by desired connection means; and a casing provided with the pair of integrated circuit substrates secured to the upper and lower surfaces thereof, forming a sealed space between these surfaces, wherein the microcomputer and its peripheral circuit elements are positioned in the sealed space and the non-volatile memory is positioned in an exposed space. In particular, when a non-volatile memory chip is used in this embodiment, a high mounting density is possible.

The objects are further achieved in the present invention by the provision of a second embodiment comprising:

a pair of integrated circuit substrates which is provided with a microcomputer and its peripheral circuit elements interconnected by a specified conductive path, a non-volatile memory positioned adjacent to the microcomputer, and conductive paths formed on the surfaces of the pair of the integrated circuit substrates and interconnected by desired connection means; and a casing which is provided with the pair of integrated circuit substrates secured to the upper and lower surfaces thereof, forming a sealed space between these surfaces, and provided with an open space on part of the integrated circuit substrate; wherein the microcomputer and its peripheral circuit elements are positioned in the sealed space and the non-volatile memory is positioned in the open space formed by the casing on part of the integrated circuit substrate. In particular, because a hole is not formed in the integrated circuit substrate of the second embodiment of the present invention, superior heat dissipation capabilities are provided. In addition, because the non-volatile memory is inserted into the side surface of the hybrid integrated circuit device, a high degree of durability and weatherability is provided.

The objects are further achieved in the present invention by the provision of a third embodiment comprising:

a pair of integrated circuit substrates which is provided with a microcomputer and its peripheral circuit elements interconnected by a specified conductive path, a non-volatile memory positioned adjacent to the microcomputer, and conductive paths formed on the pair of integrated circuit substrates and interconnected by desired connection means; and a casing provided with the pair of integrated circuit substrates secured to the upper and lower surfaces thereof, forming a sealed space between these surfaces; wherein:

the microcomputer and its peripheral circuit elements are positioned in the sealed space and the non-volatile memory is positioned in an exposed space on the surface opposite to the surface on which the microcomputer and its peripheral circuit elements are positioned. In this third embodiment of the present invention, almost the entire area of the sealed space formed by the two integrated surface substrates and the casing can be used for mounting the circuit elements, giving a high mounting density.

The objects are further achieved in the present invention by the provision of a fourth embodiment comprising:

a pair of integrated circuit substrates which is provided with a microcomputer and its peripheral circuit elements interconnected by a specified conductive path, a non-volatile memory positioned adjacent to the microcomputer, and conductive paths formed on the pair of integrated circuit substrates and interconnected by desired connection means; and a casing provided with the pair of integrated circuit substrates secured to the upper and lower surfaces thereof, forming a sealed space between these surfaces, wherein at least one section of one of the pair of integrated circuit substrates projects to a greater extent than the other integrated circuit substrate; the non-volatile memory is mounted on the projecting section of the integrated circuit substrate; and the microcomputer and its peripheral circuit elements are positioned in the sealed space. In this fourth embodiment of the present invention, almost the entire area of the sealed space formed by the two integrated circuit substrates and the casing can be used for mounting the circuit elements, giving a high mounting density and, in addition, the data in the non-volatile memory can be easily erased and rewritten. In particular, the use of a non-volatile memory chip in this embodiment is extremely effective.

In the hybrid integrated circuit device of the present invention having the above configuration, the non-volatile memory which requires the most numbers of bus-bars can be placed adjacent to the microcomputer, even if the microcomputer is optionally positioned in any place of the integrated circuit substrate. Accordingly, because the bus line between the computer and non-volatile memory is short, the mounting efficiency of the integrated circuit substrate is particularly improved, and the layout of the integrated circuit substrate can easily be designed.

In addition, because the circuit elements are fabricated in a die- or chip-form, the area occupied by these elements is small, improving the mounting efficiency of the integrated circuit substrate. Also, because a metal substrate is used as the integrated circuit substrate and a copper foil is used for the conductive path, the heat dissipation capability is excellent and the mounting density of the integrated circuit substrate is not limited by heat.

Further, because the microcomputer and the peripheral circuit elements are positioned in a sealed space formed by the integrated circuit substrate and the casing, and because the non-volatile memory positioned in an open space is shielded by resins or seal material, the reliability of the circuit elements is improved and rewriting of data in the non-volatile memory is readily carried out.

Other objects, features and advantages of the invention will hereinafter become more readily apparent from the following description.

BRIEF DESCRIPTION OF THE DRAWINGS

FIG. 25 being a block diagram of the hybrid integrated circuit device applicable to a MODEM; FIG. 26, a block diagram of the interface used; FIG. 27, a block diagram of the microcomputer used; and FIG. 28, a plan drawing of the hybrid integrated circuit device shown in the block diagram of FIG. 25.

DETAILED DESCRIPTION OF THE INVENTION AND PREFERRED EMBODIMENTS

The various embodiments of the present invention and their modifications will now be explained with reference to the drawings.

Figure 1:
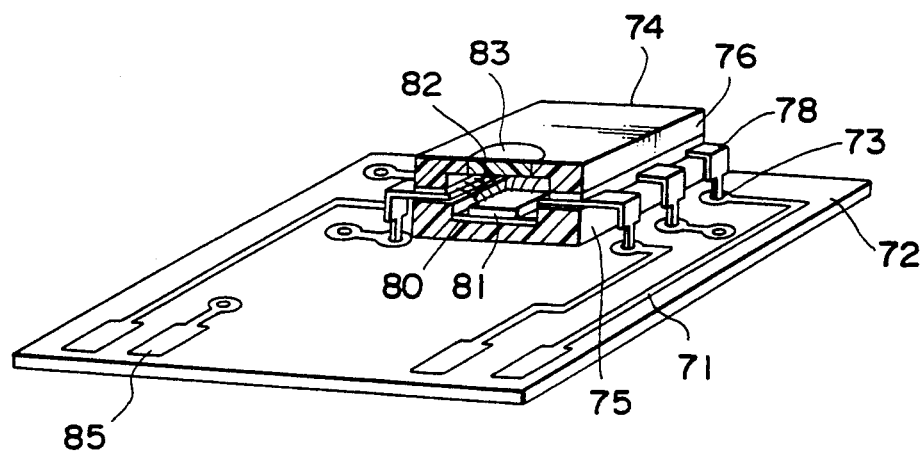
FIG. 1 and FIG. 2 are perspective views for explaining conventional non-volatile memory mounting structures.
Figure 2:
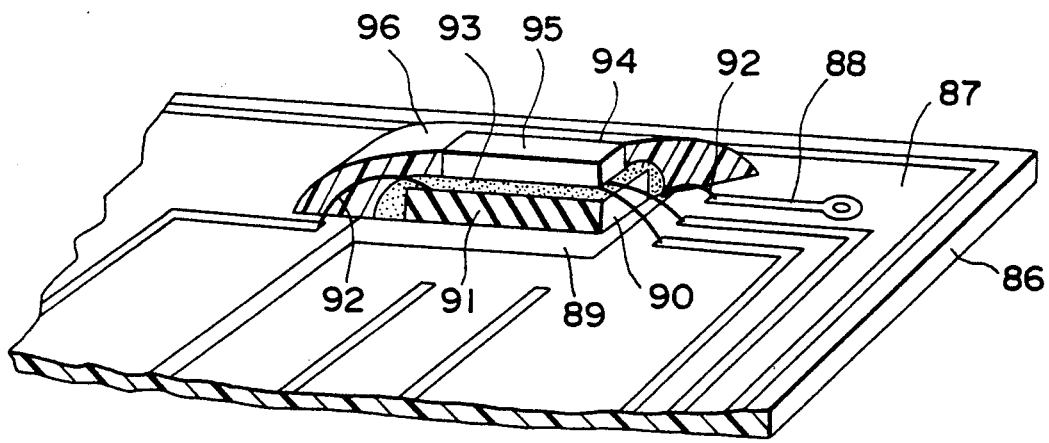
Figure 3:
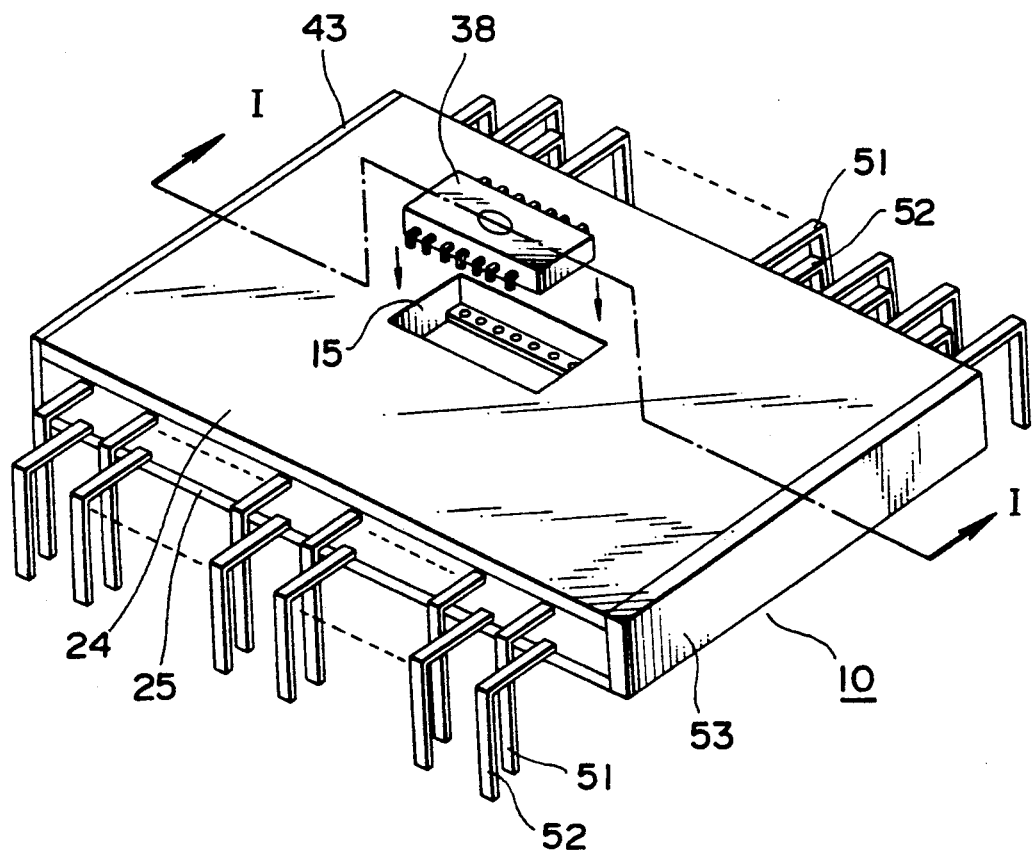
FIG. 3 is a perspective view of a first embodiment of the present invention.

Referring to FIG. 3, which is a perspective view of a first embodiment of the present invention, a hybrid integrated circuit device 10 comprises a pair of integrated circuit substrates 24, 25; a plurality of external lead terminals 51, 52; a casing 41, integrally formed with and separating the two integrated circuit substrates 24, 25; a covering body 53; and a non-volatile memory 38 positioned within a through-hole 15 in the one integrated circuit substrate 24.

Figure 4:
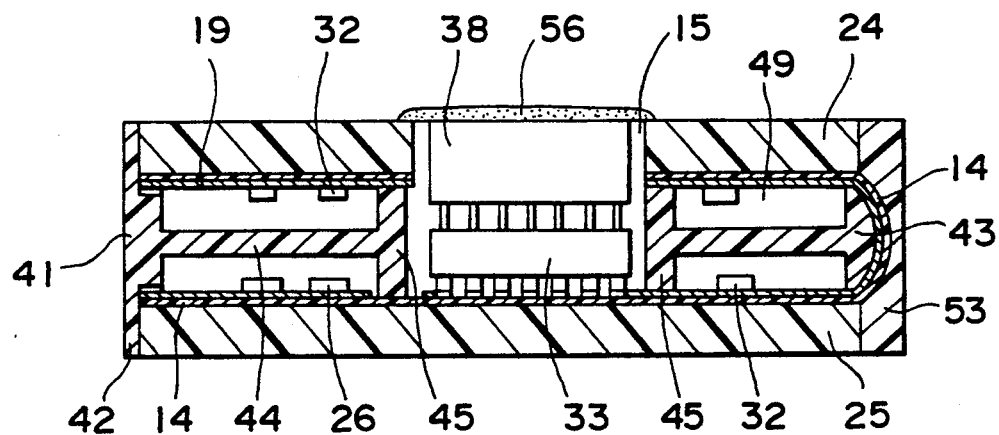
FIG. 4 is a sectional drawing viewed along the section I—I in FIG. 3.

As illustrated in FIG. 4, which is a sectional drawing viewed along the section I—I in FIG. 3, a chip-type microcomputer 26 and its peripheral circuit elements 32, and a socket 33 which are all interconnected by means of specified conductive paths 19 are secured to the integrated circuit substrates 24, 25. The socket 33 for the non-volatile memory 38 which feeds data to the micro-computer 26 is secured to the integrated circuit substrate 25, adjacent to the microcomputer 26. The through-hole 15, which becomes the insertion hole for the non-volatile memory 38, is formed in the other integrated circuit substrate 24.

The various structures and forms of the integrated circuit substrates 24, 25 used in the present invention will now be explained with reference to FIG. 5 to FIG. 7.

Figure 5:
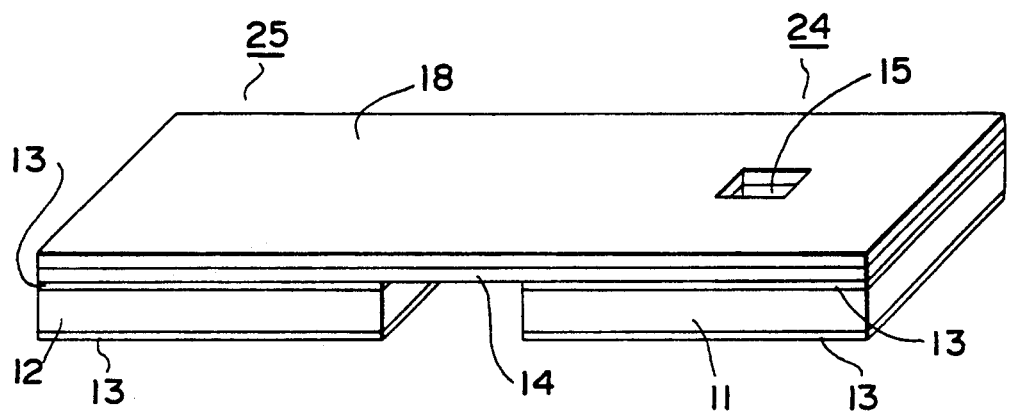
FIG. 5 to FIG. 7 are perspective views of the integrated circuit substrates used for various embodiments and modifications of the present invention.
Figure 6:
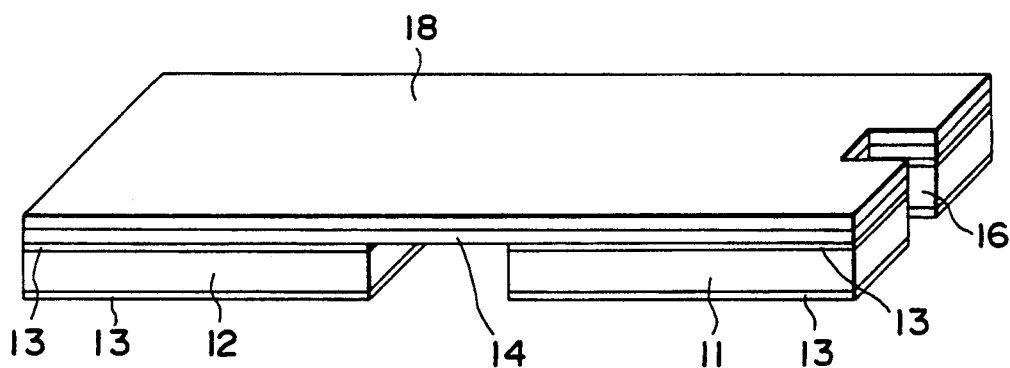

Referring to FIG. 5, a pair of aluminum substrates of same size and 0.5 mm to 1.0 mm thick are used as the bases 11, 12 of the integrated circuit substrates 24, 25 respectively. The through-hole 15 is formed in advance using a press punch or the like at the approximate center of the one base. In addition, an aluminum oxide film 13 (alumite layer) is formed on the aluminum bases 11, 12 using a commonly known anodic oxidation process. A hard material such as a ceramic, glass-epoxy, or metal, or the like could also be used for the bases 11, 12. Because of its heat dissipation characteristics, mechanical strength, and workability, the aluminum base is considered to be the most suitable. Further, in the various embodiments or modifications of the present invention shown in FIG. 6 and FIG. 7, the integrated circuit substrates 24, 25 may have a recess 16 formed in a peripheral sections of one of the aluminum bases 11, 12, or a part of the aluminum bases 11, 12 may project, although the basic structures of all the integrated circuit substrates used in the present invention are the same.

A flexible insulating resin layer 14 of polyimide or the like, 10 μm to 70 μm thick, and a copper foil 18, 10 μm to 70 μm thick, are simultaneously affixed by some means such as a roller or hot press or the like to one main side surface of the aluminum bases 11, 12 on which the oxidized aluminum film 13 has been formed.

Next, the surface of the copper foil 18 of these multilayerd substrates 24, 25 is subjected to a screen printing process using a resist film as a mask so that a specified conductive path is left exposed, followed by a process whereby a noble metal (gold, silver, platinum) coating (omitted from the drawings) is applied. After the removal of the resist, the integrated circuit substrate, on which the specified conductive path 19 is formed, is obtained by etching the copper foil 18 using the noble metal coating layer as a mask. The pattern boundary of the conductive path 19 from a screen printing process is 0.5 mm, but it is possible to form an extremely fine conductive path 19 with a 5 μm rule by using commonly known photolithography.

A chip-type microcomputer 26 and a plurality of peripheral circuit elements 32 such as chip ICs, chip transistors, chip resistors, and chip condensers, and the like are then secured to the circuit substrate on which the specified conductive path 19 has been formed, by means of a plastic material such as solder or silver paste or the like. The electrodes of these circuit elements 32 and microcomputer are wire bonded close to the end of the conductive path 19, and the electrode of the socket 33 is soldered to the specified conductive path 19 to fabricate the integrated circuit substrates 24, 25 shown in FIG. 4. The integrated circuit substrates 24, 25 are also provided with a carbon resistor by screen-printing of a carbon resistor body or with a nickel resistor formed by nickel plating (omitted from the drawings), between the conductive paths 19.

The integrated circuit substrates 24, 25 formed in this manner are separated by a specified spacing, mechanically linked by means of the flexible insulating resin layer 14, and electrically interconnected by the conductive paths 19 formed on the insulated resin layer 14. Each conductive path 19 can be interconnected using a metal lead terminal other than the above means, and, in that case, the lead terminals are secured using a plastic material, e.g. solder, to each end section of the integrated circuit substrates 24, 25, integrally formed with the casing 41 (later-explained). Each lead terminal is also connected to other end section.

Figure 8:
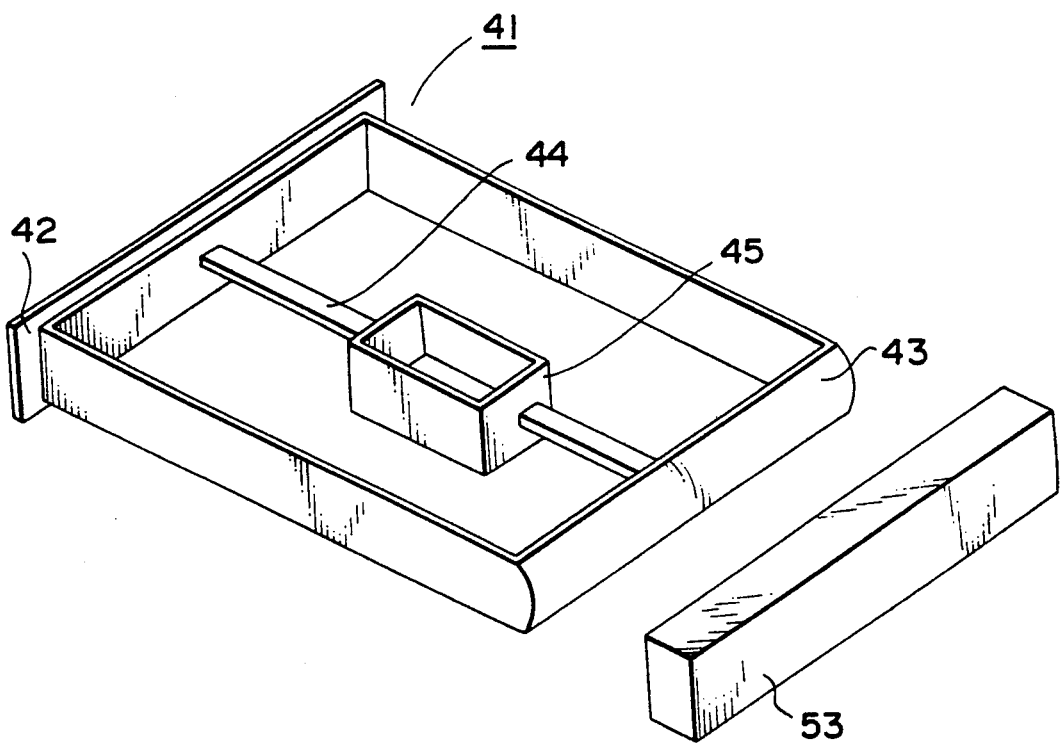
FIG. 8 to FIG. 11 are perspective views of the casing used for various embodiments and modifications of the present invention.

Next, the structure of the casing 41 used on the hybrid integrated circuit device 10 of the present invention will be explained. The casing 41 is generally constructed in the shape of a frame, as illustrated in FIG. 8, and is obtained by the creation of an integrated body from a panel 42 forming one side of the hybrid integrated circuit device 10, an arc-shaped section 43 on the opposite side, and an auxiliary frame 45 connected to a linking bar 44 by using an insulating thermoplastic resin. When the integrated circuit substrates 24, 25 are positioned in opposition interposing the casing 41, as is more clearly shown in FIG. 4, the arc-shaped section 43 functions so that the insulating resin layer 14 which links the integrated circuit substrates 24, 25 is not bent at an acute angle, thus preventing the break of the conductive paths 19. The auxiliary frame 45 seals the space which is opened by the through-hole 15 formed in the integrated circuit substrate 24, and forms a sealed space 49 in which the microcomputer 26 and its peripheral circuit elements 32 are positioned.

Figure 9:
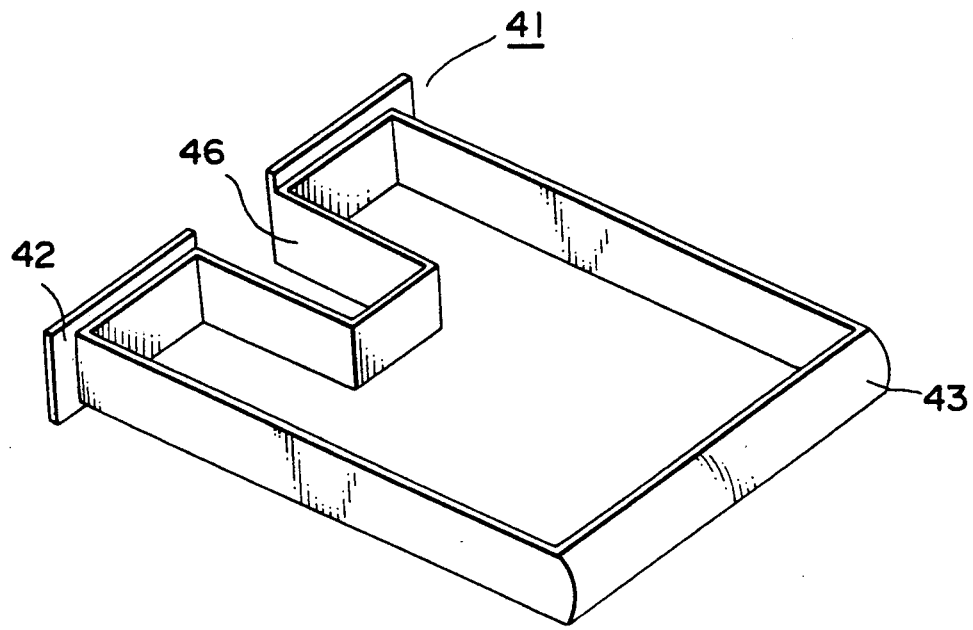
Figure 10:
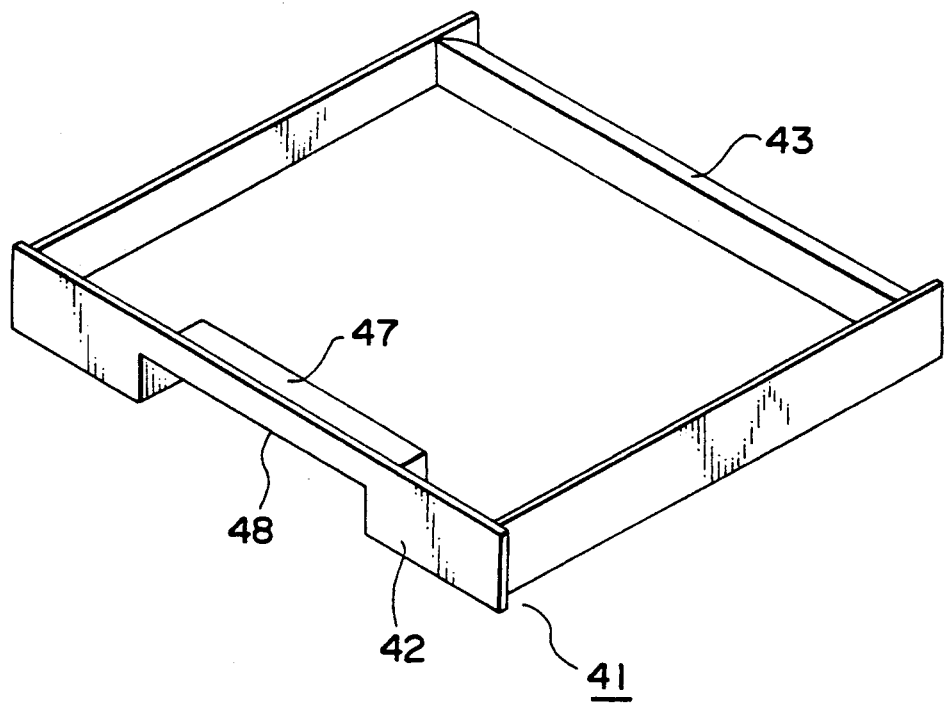
Figure 11:
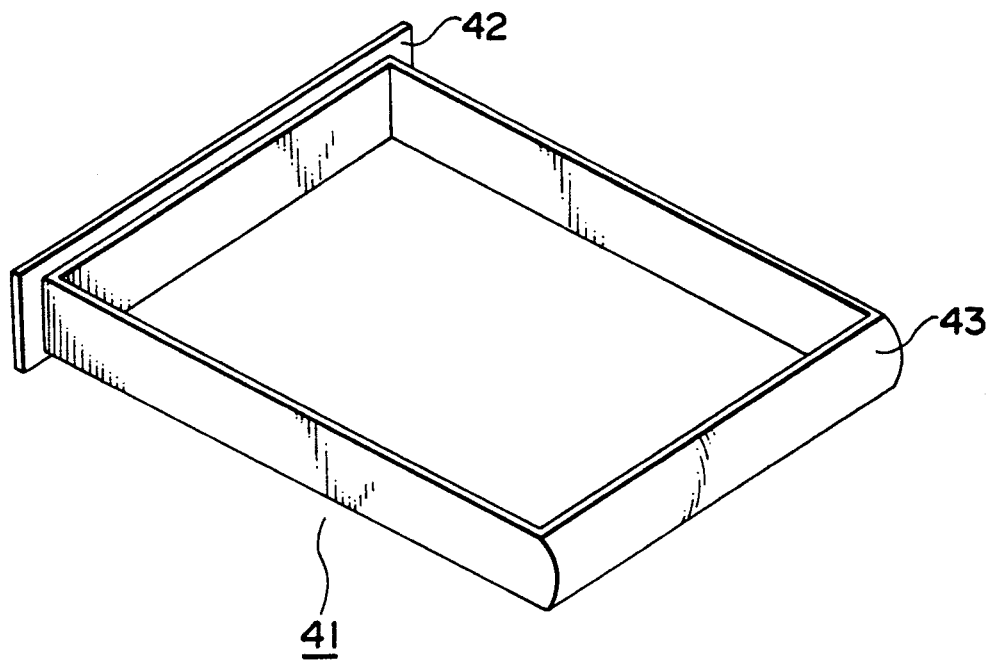

The casing 41 can have one part 46 of the frame section bent, can be formed in a stepped shape 47, or can be formed as a simple frame to correspond to the various embodiments and modifications of the present invention, as shown in FIG. 9 to FIG. 11.

The integrated circuit substrates 24, 25 are bonded to the upper and lower surfaces of the casing 41 using an adhesive sheet or the like so as to position the circuit elements face to face. At this time the exposed linking section of the insulating resin layer (14) is sealed by the covering body 53 which is also shown in FIG. 8. The covering body 53 is also formed of the same material as the casing 41 and bonded to the side surfaces of the integrated circuit substrates 24, 25 by the above-mentioned adhesive sheet.

Figure 12:
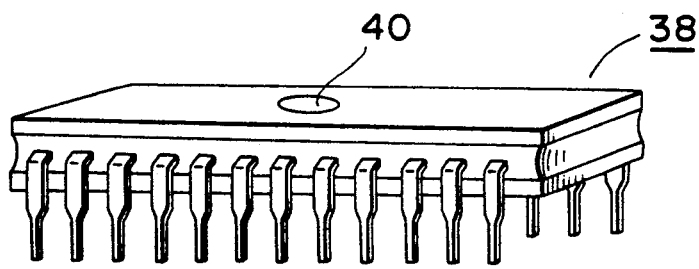
FIG. 12 and FIG. 13 are a perspective view and a sectional drawing respectively of a DIP-type non-volatile memory.
Figure 13:
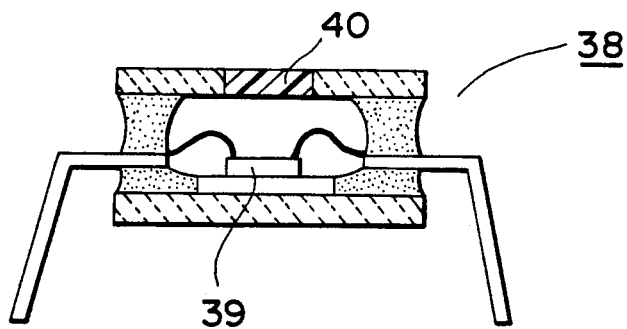
Figure 14:
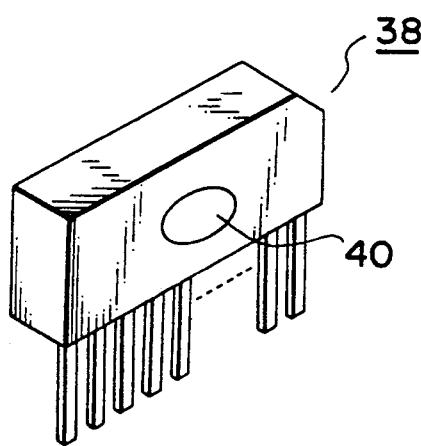
FIG. 14 and FIG. 15 are a perspective view and a sectional drawing respectively of a SIP-type non-volatile memory.
Figure 15:
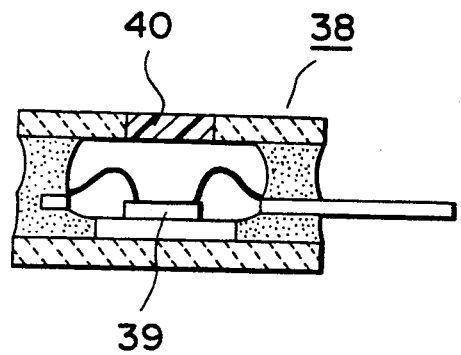

An EPROM (Erasable Programmable Read Only Memory: hereinafter EPROM element will refer to a molded non-volatile memory, EPROM chip to a chip-type non-volatile memory, with EPROM used as the general term) from which data can be erased by ultraviolet light is used as the nonvolatile memory 38. A DIP-type (Dual-In-Line) EPROM as shown in FIG. 12 and FIG. 13 is frequently used as the EPROM element 38; a SIP-type (Single-In-Line) EPROM as shown in FIG. 14 and FIG. 15 is also used. With either of these types of EPROM element 38 an ultraviolet-light-transmitting member 40 through which UV light can be transmitted to erase data is positioned on the upper surface of an EPROM chip 39.

Figure 16:
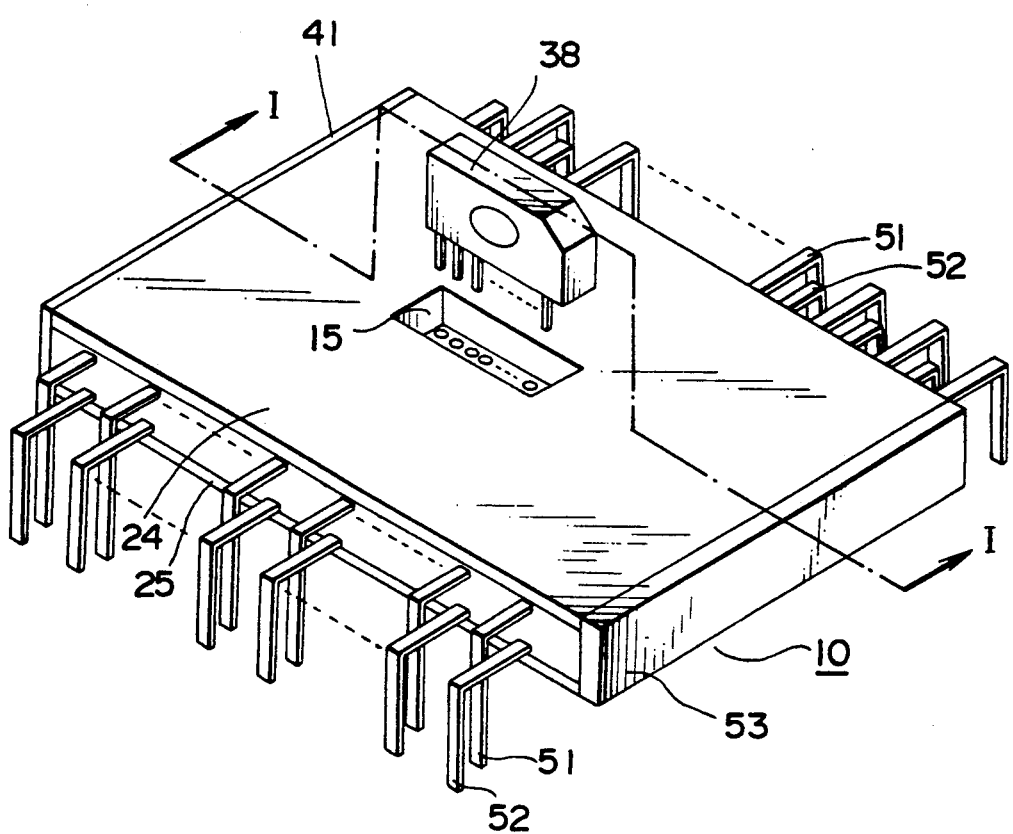
FIG. 16 is a perspective view of a first embodiment of the present invention suitable for the mounting of a SIP-type non-volatile memory.

Because of the fact that a DIP-type EPROM element is normally used, the hybrid integrated circuit device 10 using a DIP-type EPROM element is shown in FIG. 3 and FIG. 4. However, in the present invention the structure and shape of the EPROM element used is optional. The SIP-type EPROM element shown in FIG. 14 and FIG. 15 can also be used. Perspective view of an embodiment using this SIP-type EPROM element is shown in FIG. 16, in which the same reference numbers are used as in FIG. 3 for the equivalent parts, so further explanation will be omitted.

EPROM elements are broadly divided into the resin molded package type and the ceramic package type, depending on the package material used. However, either type of EPROM element can be used in the present invention. These types of EPROM device are disclosed in Japanese Laid Open Patents No. 74358/1978 and No. 290160/1987.

In addition, an LCC-type or PLCC-type of EPROM element can be used in the present invention. LCC and PLCC types of EPROM elements are provided with connector elements on the bottom, close to each of the four sides, and are mounted on the substrate through a socket in the same way as a DIP-type EPROM element. When an LCC-type or PLCC-type of EPROM element is used the hybrid integrated circuit device 10 can be made even smaller. As discussed later in more detail referring to a modified embodiment, an EPROM chip can also be used in the present invention.

Figure 17:
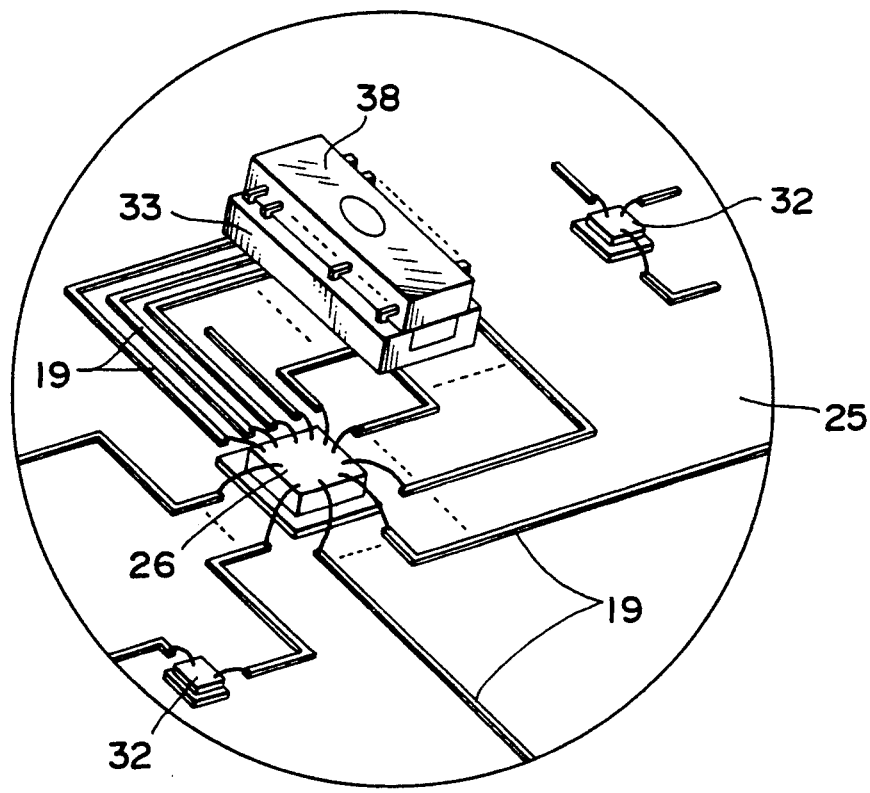
FIG. 17 is an enlarged drawing showing the area around the EPROM on the integrated circuit substrate.

The positional relationship of the EPROM element 38 and the microcomputer 26 will now be explained with reference to FIG. 17. FIG. 17 is an expanded drawing of part of the integrated circuit substrate 25. The drawing shows the integrated circuit substrate 25 on which a plurality of conductive paths 19 is formed; the chip-type microcomputer 26 and the peripheral circuit elements 32 which are die bonded to the integrated circuit substrate 25; and the socket 33 into which the EPROM element 38 is inserted. The conductive paths 19 terminate adjacent to the microcomputer 26, the socket 33, and the peripheral circuit elements 32, and these terminal sections are wire bonded to the elecrodes of the microcomputer 26 and the peripheral circuit elements 32. In addition, the other terminal section of each of the conductive paths 19 which are connected to the electrode of the microcomputer 26 is soldered to one of the electrodes of the socket 33.

The microcomputer 26 and the EPROM element 38 must be interconnected by many conductive paths 19 which serve as an address bus, a data bus, and a control bus. If the microcomputer 26 and the EPROM element 38 are far apart, the percentage of the integrated circuit substrate 25 occupied by the conductive paths 19 is so large that it cannot be disregarded. However, because there are no restrictions on the position of the EPROM element 38 in the hybrid integrated circuit device 10 of the present invention, the EPROM element 38 can be positioned adjacent to, or as close as possible to, the microcomputer 26. As a result, the area occupied by the conductive paths 19 is reduced, making it possible to effectively utilize the mounting area of the integrated circuit substrate 25.

Again referring to FIG. 4, after the position of the EPROM element 38 on the integrated circuit substrate 25 has been determined, as outlined above, the position of the through-hole 15 on the integrated circuit substrate 24 is determined.

The shape of the through-hole 15 is essentially the same as the external form of the EPROM element 38, but the size of the through-hole is made slightly larger than the EPROM element 38 to provide for easy insertion of the EPROM element 38. At this time, the upper surface of the EPROM element 38 and the upper surface of the integrated circuit substrate 24 can be made to coincide by suitable design of the thickness of the casing 41 and the height of the socket 33. The handling characteristics and reliability of the hybrid integrated circuit device 10 of the present invention designed in this manner are highly superior. The microcomputer 26 and the peripheral circuit elements 32, which are connected to the EPROM element 38, and resistance elements are positioned in the sealed space 49 formed between the two integrated circuit substrates 24, 25 and the casing 41.

A light-shielding seal material 56 is then applied to the through-hole 15 in the integrated circuit substrate 24, into which the EPROM element 38 has been inserted. This seal material 56 completely shuts out any ultraviolet light and provides a full hermetic seal at the EPROM element 38, to complete the hybrid integrated circuit device 10. However, if an SIP-type EPROM element is used, the light-shielding seal material 56 does not necessarily have to be used because the ultraviolet-light-transmitting section is embedded in the integrated circuit substrate 24.

With the present embodiment thus constructed, the data is erased from the EPROM element 38 by peeling off the light-shielding seal material 56 and directing UV light onto the EPROM element 38, or by removing the EPROM element 38 from the socket 33 and subjecting it to UV light. Rewriting of the data into the EPROM element 38 is carried out by removing the element 38 from the socket 33 and using an ordinary ROM WRITER.

As a matter of course, the position where the microcomputer is mounted is relocated according as the specifications of the hybrid integrated circuit device is modified. Accordingly, the position on the integrated circuit substrate of the EPROM element which is placed adjacent to the microcomputer is also modified by the specifications of the hybrid integrated circuit device. The hybrid integrated circuit device of the present invention is also capable of coping with this type of specification change. A modification in which the EPROM element 38 is resultantly positioned at the end of the integrated circuit substrate 25 will now be explained.

Figure 18:
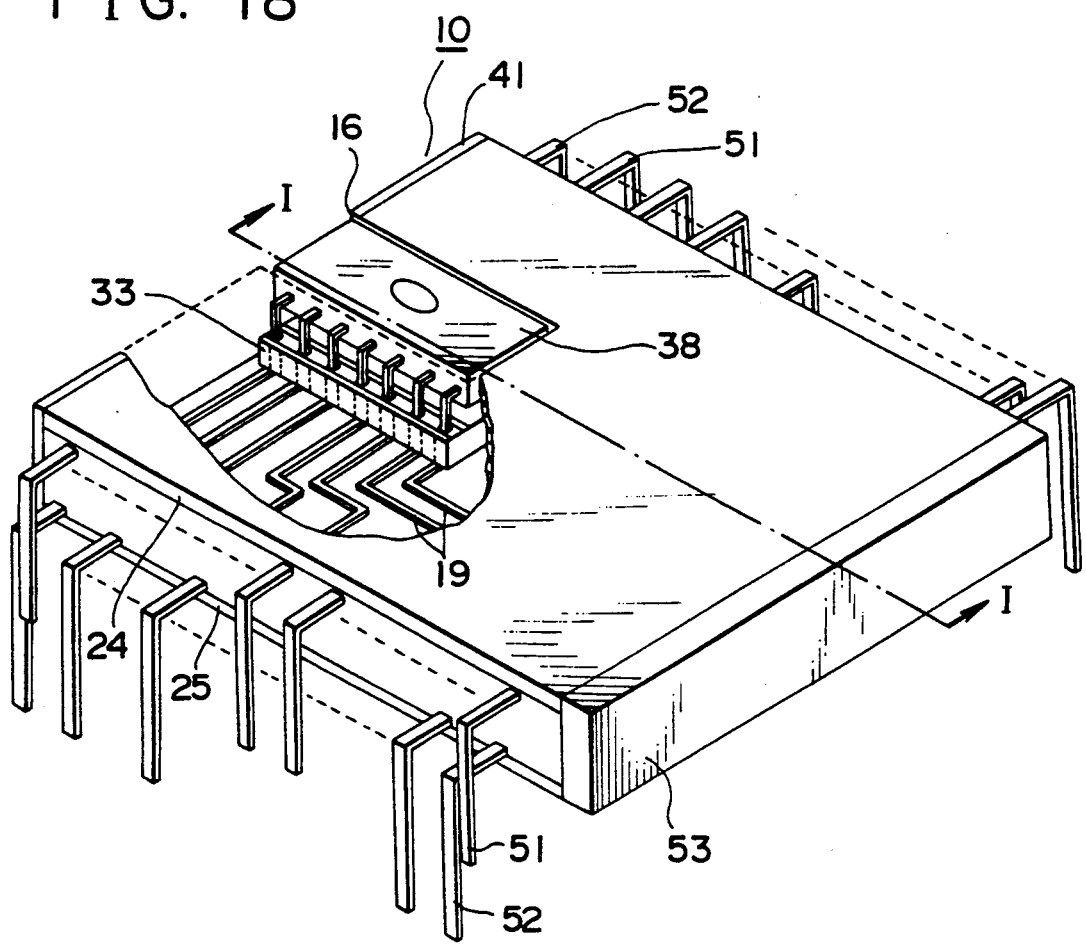
FIG. 18 is a perspective view of a modification of the first embodiment in which a DIP-type non-volatile memory is used.

FIG. 18 is a perspective view illustrating the internal structure of this modification, with one part of the integrated circuit substrate 24 in section, wherein the hybrid integrated circuit device 10 comprises the integrated circuit substrate 24 with a notch 16 formed in an end section; the integrated circuit substrate 25 on which a plurality of conductive paths 19 is formed with these conductive paths 19 connected to the socket 33; the external lead terminals 51, 52; the casing 41, integrally formed with and separating the two integrated circuit substrates 24, 25; the covering body 53; and the DIP-type EPROM element 38 inserted in the notch 16 in the integrated circuit substrate 24. Accordingly, the integrated circuit substrates 24, 25 shown in FIG. 6 are used in this modification, as well as the casing 41 shown in FIG. 9.

Figure 19:
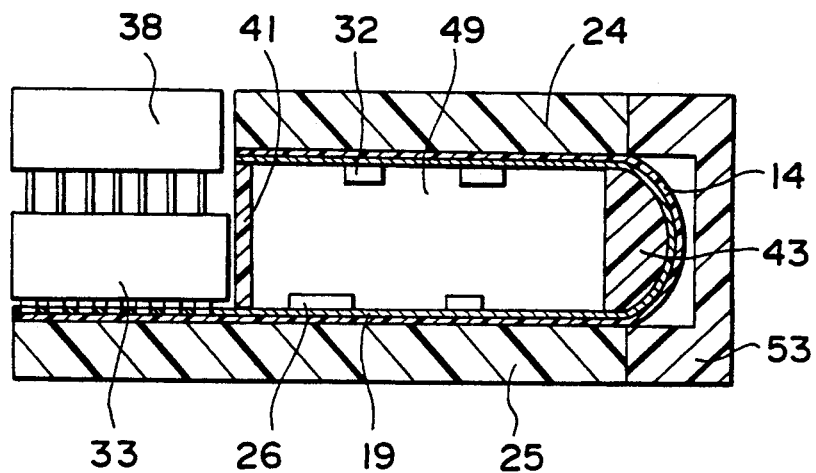
FIG. 19 is a sectional drawing viewed along the section I—I in FIG. 18.

As shown in FIG. 19, which is a sectional drawing viewed along the section I—I of FIG. 18, the integrated circuit substrates 24, 25 are secured to the upper and lower surfaces of the casing 41, using an adhesive sheet or the like, and the space opened by the notch 16 of the integrated circuit substrates 24 is sealed by the bent section 46 of the casing 41 to form the sealed space 49. With the exception of the EPROM element 38, the microcomputer 26, the peripheral circuit elements 32 and the like are positioned in the sealed space 49, and the EPROM element 38 and the socket 33 are set in the position exposed by the notch 16. After the casing 41 and the two integrated circuit substrates 24, 25 are integrally combined, the exposed linking, insulating resin layer 14 is sealed by the covering body 53 in the same manner as in the previous embodiment.

Figure 20:
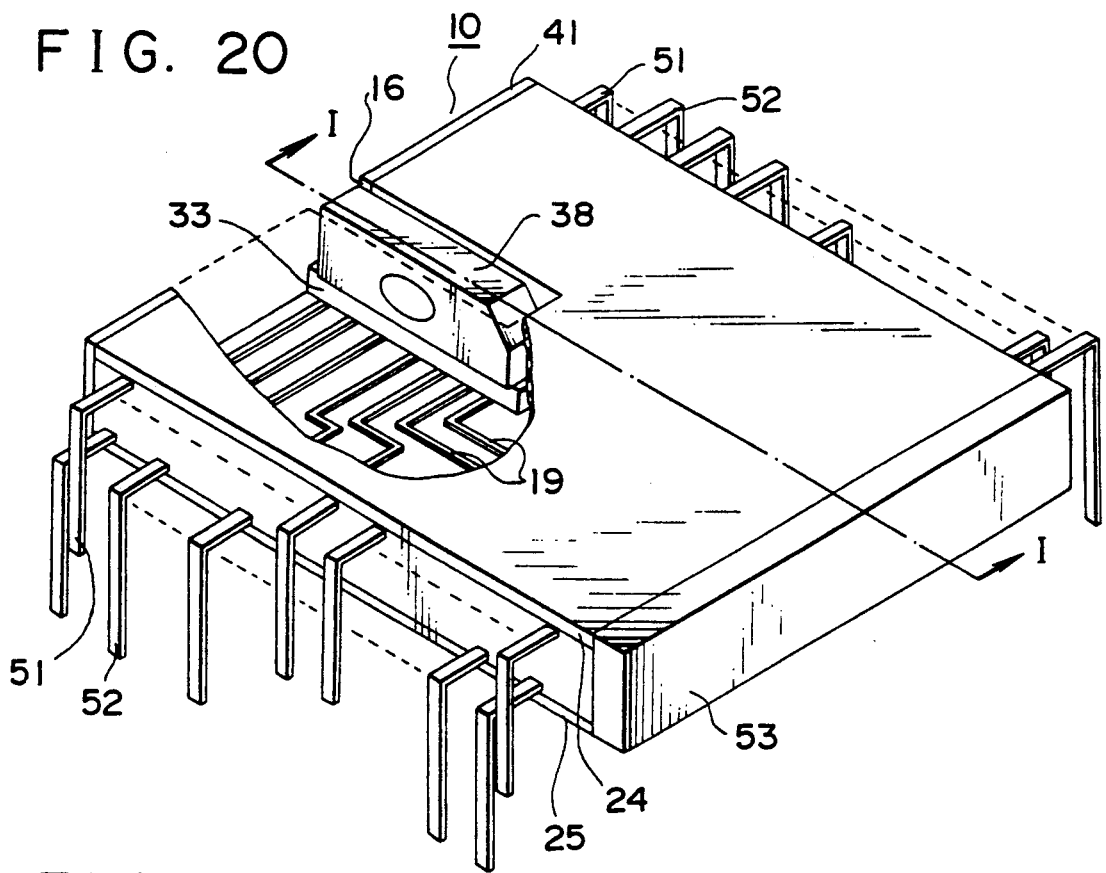
FIG. 20 is a perspective view of a modification of the first embodiment of the present invention suitable for the mounting of a SIP-type non-volatile memory.

The SIP-type EPROM element can also be used in this modification. FIG. 20 is a perspective view showing this modification using the SIP-type EPROM element. In this drawing the parts equivalent to those in the embodiment shown in FIG. 18 carry the same reference numbers, so further explanation will be omitted.

Figure 21:
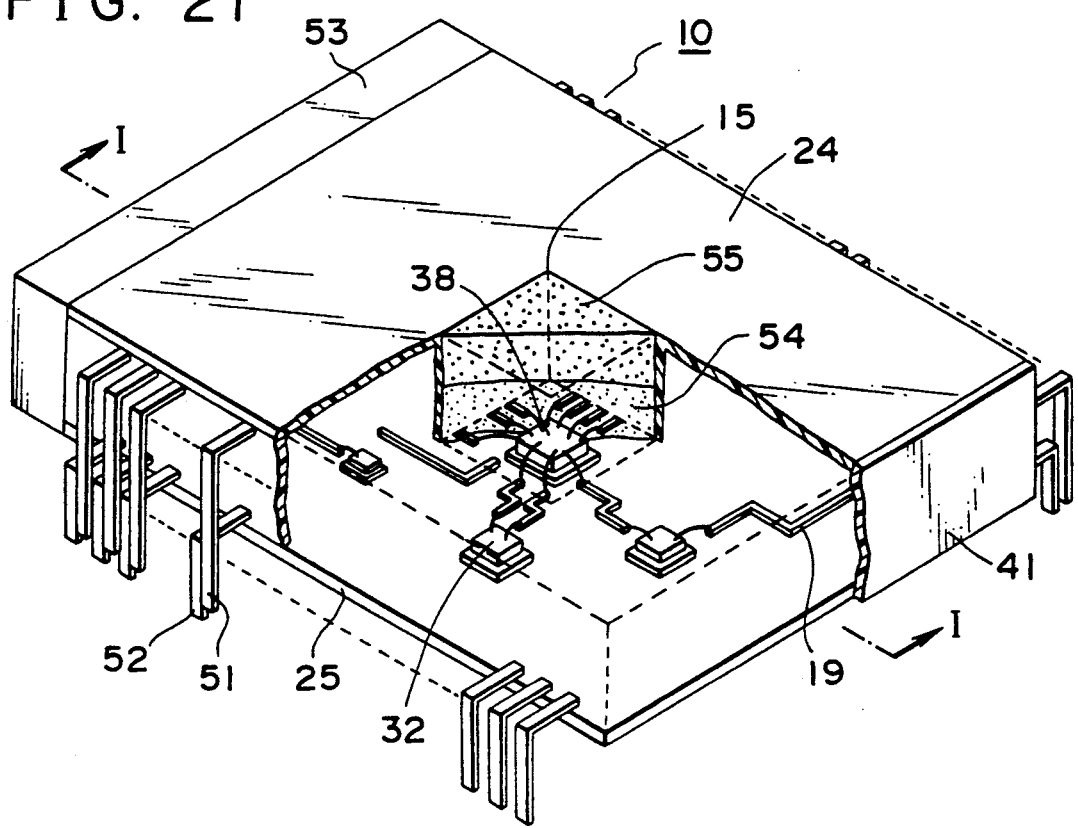
FIG. 21 is a perspective view of another modification of the first embodiment of the present invention
Figure 22:
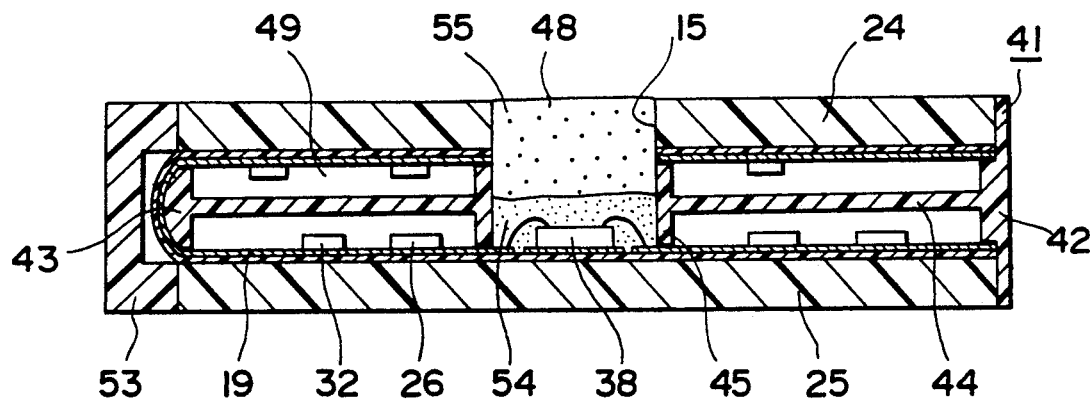
FIG. 22 and FIG. 23 are drawings viewed along the section I—I in FIG. 21 explaining a different resin cover structure.
Figure 23:
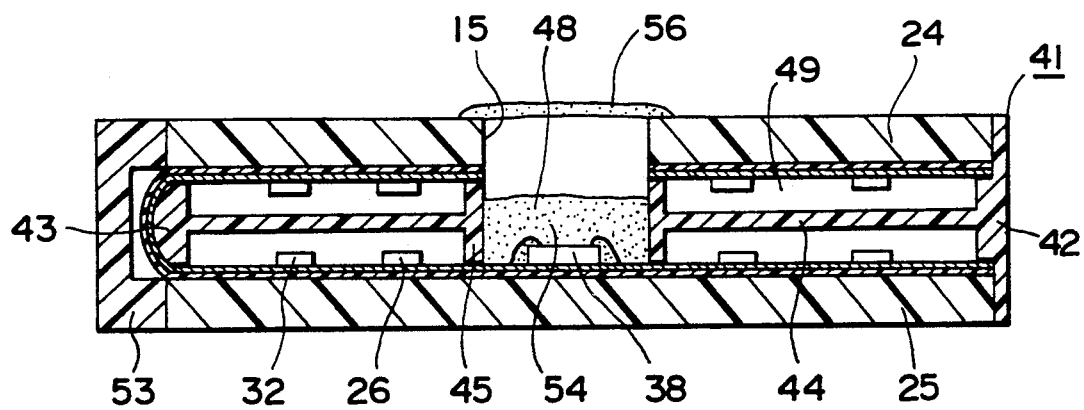

Referring to FIG. 21 to FIG. 23, another modification of the first embodiment wherein the EPROM chip is used instead of the EPROM element will be explained.

FIG. 21 is a perspective view illustrating the internal structure of this modification, with one part of the integrated circuit substrate 24 in section, wherein the hybrid integrated circuit device 10 comprises the integrated circuit substrate 24 with the previously formed through-hole 15; the integrated circuit substrate 25 to which the microcomputer 26, the EPROM chip 38, and the peripheral circuit elements 32 are secured; the external lead terminals 51, 52 which are respectively secured to a plurality of pads (omitted from the drawings) of the integrated circuit substrates 24, 25; the casing 41, integrally formed with and separating the two integrated circuit substrates 24, 25; and the covering body 53. The EPROM chip 38 is secured in a position adjacent to the microcomputer 26 on the integrated circuit substrates 25 using a plastic material such as silver paste, solder or the like. The electrode of the EPROM chip and the terminal section of the conductive paths 19 formed close to the EPROM chip 38 are interconnected by ultrasonic bonding with a bonding wire such as aluminum wire or the like. The conductive paths 19 are efficiently routed to the terminal close to the microcomputer 26 and connected to the electrode of the microcomputer 26, also by wire bonding with aluminum wire or the like. This modification uses the integrated circuit substrates 24, 25 and casing 41 of the same structure and almost the same shape as the embodiment shown in FIG. 3.

As shown in FIG. 22, which is a sectional drawing viewed along the section I—I of FIG. 21, the integrated circuit substrates 24, 25 are bonded to the casing 41 by means of an adhesive sheet or the like. The microcomputer 26, the peripheral circuit elements 32, and the like with the exception of the EPROM element 38 are secured to the integrated circuit substrates 24, 25 so as to be positioned in the sealed space 49 formed by the two integrated circuit substrates 24, 25 and the casing 41. The EPROM chip 38 is secured in the position exposed by the through-hole 15 on the integrated circuit substrate 25, and is enclosed by the auxiliary frame 45 of the casing 41.

One or more layers of resin are filled into the space 48 enclosed by the auxiliary frame 45. The EPROM chip 38 and the bonding wire which connects the electrode of the EPROM chip 38 to the conductive paths 19 is completely covered by the resin layer(s). An ultraviolet transmitting resin 54 through which the data on the EPROM chip 38 can be erased is used as the first resin layer which is in direct contact with the EPROM chip 38. The ultraviolet transmitting resin 54 can be any non-aromatic-type resin, for example, a methyl-type silicon rubber or silicon gel. A non-ultraviolet-transmitting resin 55 is used as the second resin layer to act as a UV shield for preventing erroneous erasure of the data on the EPROM chip 38. There are no restrictions as to the non-UV light transmitting resin 55 used, providing it contains an aromatic ring (benzene ring). For example, an epoxy resin or polyimide resin which contains an aromatic ring (benzene ring) is used and filled in until its surface almost corresponds with the top surface of the integrated circuit substrate 24.

As an alternative, the shielding seal material 56 can be used in place of the non-UV light transmitting resin 55, as shown in FIG. 23, and the same effect can be expected when the seal material 56 is applied over the through-hole 15.

Figure 24:
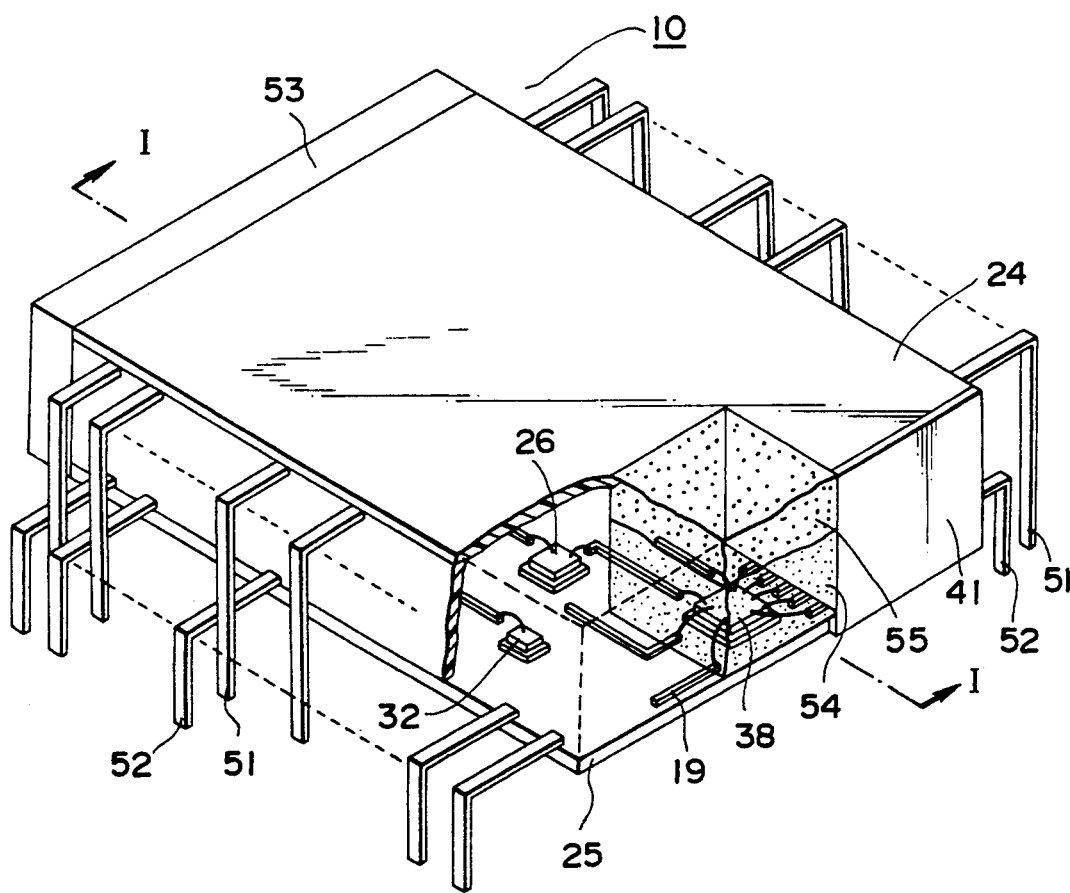
FIG. 24 is a perspective view of another modification of the first embodiment of the present invention

As was previously explained, the position of the microcomputer is changed according to the specifications of the hybrid integrated circuit device 10, and the position on the integrated circuit substrate 25 of the EPROM chip 38 which must be positioned adjacent to the microcomputer is also changed. In this modification using the EPROM chip 38, correspondence with the specifications is also possible so that the EPROM chip 38 is positioned relatively close to the periphery of the integrated circuit substrate 25. FIG. 24 shows this type of modification. The only difference between this modification and the previous modification shown in FIG. 21 is that in the previous modification the through-hole 15 for the EPROM chip 38 was formed relatively close to the center of the integrated circuit substrate 24, while in this modification the notch 16 which corresponds to the through-hole 15 is inevitably formed at the periphery of the integrated circuit substrate 24. Accordingly, for the other parts of FIG. 24 which correspond respectively to the parts in FIG. 21, the identical reference numbers are attached, so further explanation is omitted.

In the above modification, the data on the EPROM chip 38 is erased by stripping off the non-UV light transmitting resin 55 or the seal material 56, then directing ultraviolet light onto the EPROM chip 38. Rewriting is accomplished by stripping further the UV light transmitting resin 54 over the EPROM chip 38, then contacting the conductive path 19 connected to the electrode of the EPROM chip 38 with th terminal of a probe or the like and writing in data from a write-in device. Because the adhesive strength of the UV light transmitting resin 54 is low there is no concern about breakage of the bonding wire during this stripping procedure.

Here, in order to improve understanding of the present invention, before explaining the other embodiments an explanation will be given of the hybrid integrated circuit device 10 of the present invention which can be applied to a MODEM for data transmission via telephone circuits from the data terminal of a computer system or the like.

Figure 25:
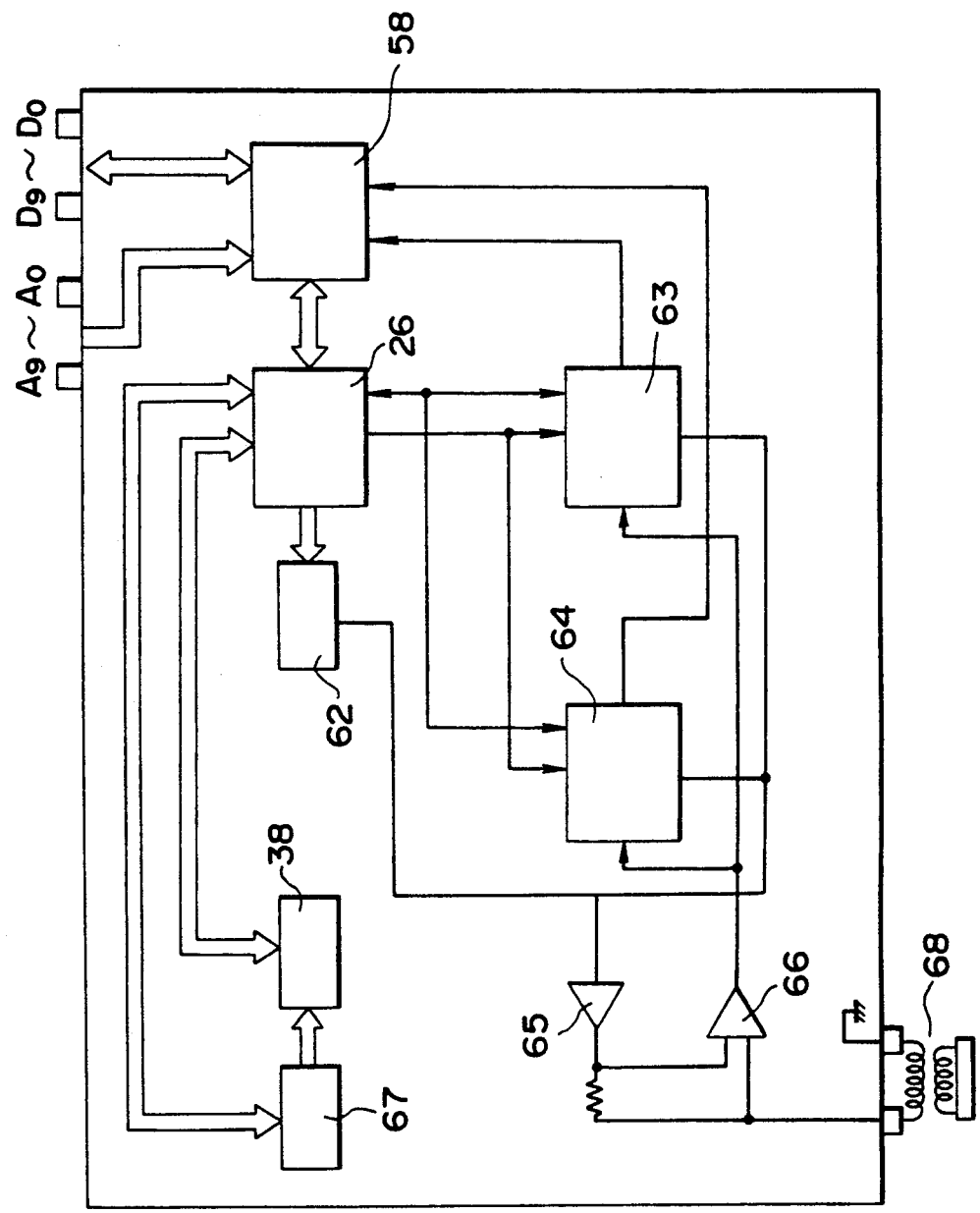
FIG. 25 to FIG. 28 are explanatory drawings of a hybrid integrated circuit device of the present invention suitable for use in a MODEM.

Referring to FIG. 25, which shows a block diagram with the MODEM mounted on the integrated circuit substrates 24, 25, the MODEM comprises a DTE interface 58 which outputs data transmitted from a computer system and stored in a built-in memory; the microcomputer 26 which outputs a specified output signal according to the data output from the DTE interface 58; the EPROM 38 which is accessed from the microcomputer 26; a first and second modulator-demodulator circuits 62, 63 which modulate and demodulate the output signal from the microcomputer 26 and output them to an NCU (Network Control System) (omitted from the drawings); and a DTMF generator 64 which generates a desired DTMF signal (tone signal) corresponding to the output signal from the microcomputer 26.

An integrated circuit such as, for example, an STC9610 (trademark, manufactured by Seiko-Epson) is used for the DTE interface 58. Now referring to FIG. 26 which is a block diagram of this type of DTE interface 58, the DTE interface 58 comprises a transmission memory section 59 which temporarily stores the output signal from the computer system 70 in its built-in memory and outputs it to the microcomputer 26; a reception memory section 60 which stores the output signal from the microcomputer 26 in its built-in memory and outputs it to the computer system 70; and a control section 61 which switches the various input/output signals via the transmission memory section 59 and the reception memory section 60, and has the specified function necessary for connecting the computer system 70 and the microcomputer 26.

Figure 27:
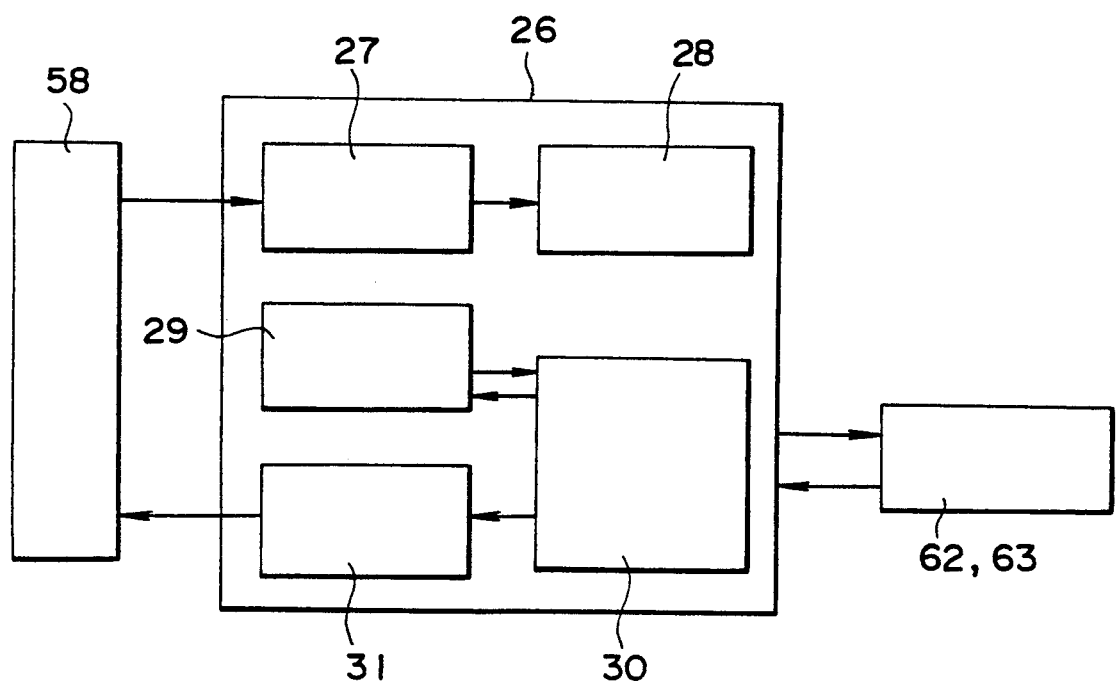

An integrated circuit such as, for example, an STC9620 (trademark, manufactured by Seiko-Epson) is used for the microcomputer 26. Now referring to FIG. 27 which is a block diagram of the microcomputer 26, the microcomputer 26 comprises a command recognition section 27 for the recognition of signals output from the DTE interface 58; a command decoding section 28 which decodes the output signals recognized by the command recognition section 27; a command execution section 30 which compares the data in a memory section 29 according to the signal decoded in the command decoding section 28 and feeds the data to the modulator-demodulator circuits 62, 63; a response code generation section 31 which compares the data in the command decoding section 28 with the data in the memory section 29 and outputs a signal to the DTE interface 58 when erroneous data is fed to the command execution section 30.

Again referring to FIG. 25, the modulator-demodulator circuits 62, 63 convert a digital signal transmitted from the microcomputer 26 to an analog signal and transmit it to the NCU section (omitted from the drawings), and, conversely, convert an analog signal transmitted from the NCU section to a digital signal and transmit it to the microcomputer 26. The modulator-demodulator circuits 62, 63 are low speed and medium speed circuits. The first modulator-demodulator circuit 62 is a low speed, 300 bps circuit, and the second modulator-demodulator circuit 63 is a medium speed, 1200 bps circuit. The microcomputer 26 selects either the first or second of the modulator-demodulator circuits 62, 63.

The DTMF generator 64 outputs a specific DTMF signal to a transmission AMP 65 and outputs the signal to the telephone circuits, transmitting the data output from the command execution section 30 of the microcomputer 26 to the respective COL, ROW input terminals, Program data for setting the various kinds of modes of the MODEM is stored in memory in the EPROM 38. This data is fed to the microcomputer 26 according to an address designated by the microcomputer 26.

Figure 26:
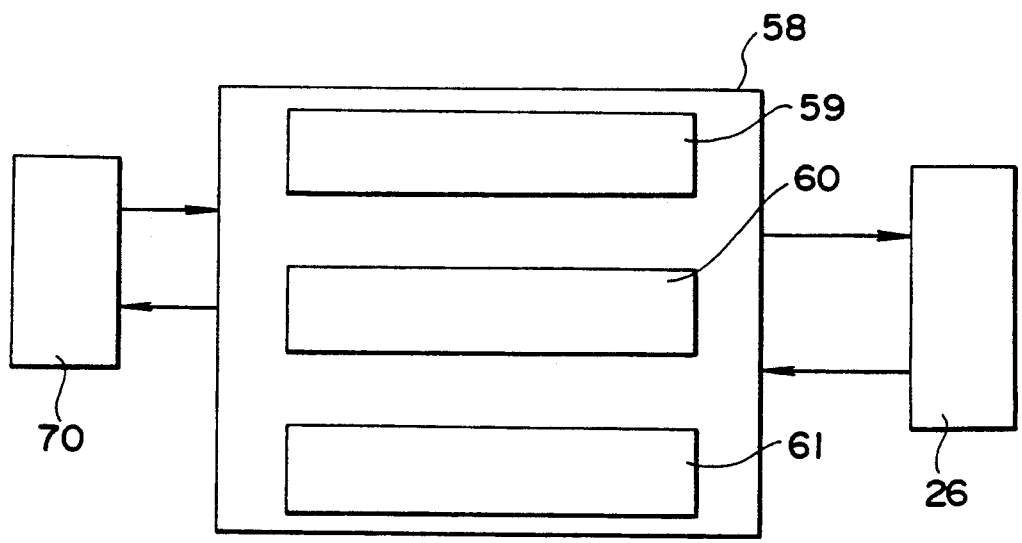

The action of the MODEM will be briefly explained with reference to FIG. 25 and FIG. 26. On the commencement of data communication, a control switch 67 is activated according to a call signal from the microcomputer 26. Specific address data is fed to the EPROM 38, and the program data in the EPROM 38 is fed to the microcomputer 26 according to this address data. A check is made to confirm that the various modes, such as the communication standards (Bell/CCITT standards), the communication speeds (300/1200 bps), format correspondence, and the DIP switch switching modes of the various MODEMs which carry out the communications are in agreement.

When these modes are in agreement the telephone number of the MODEM of the response side computer system 70 is keyed in and this telephone number is input to the DTE interface 58 used as the interface with the computer system 70. This telephone number is also transmitted to the microcomputer 26 for decoding. The result decoded by the microcomputer 26 is transmitted to the DTMF generator 64. The DTMF signal of the DTMF generator 64 is transmitted to the ordinary telephone circuits through a transmission amplifier 65 and a line transformer 68.

The transmitted DMTF signal sends out a CALL signal to the response side MODEM. The response side MODEM receives and automatically accepts the CALL signal. Consequently, the response side MODEM transmits an answer tone to the call side MODEM, that is, the hybrid integrated circuit device 10 of the present invention, for connection procedures.

The call side MODEM determines whether or not this is the specified call side MODEM answer tone. If the correct answer tone has been received, this MODEM enters communication status.

On entering communication status, parallel data according to a specific keyed input signal, through a keyboard (omitted from the drawings) of the call side microcomputer 26 is input to the DTE interface 58. This data is also transmitted to the microcomputer 26. Then, the parallel data is converted to serial data and is transmitted to the low speed modulator-demodulator circuit 62. Here, the digital signal is converted to an analog signal and undergoes frequency modulation (FSK) based on the communication standards, and is transmitted to the response side MODEM via the transmission amplifier 65 and the line transformer 68.

The frequency modulated analog signal according to the keyed input signal from the response side computer system 70 is transmitted to the call side MODEM and is input to the low speed modulator-demodulator circuit 62 through the line transformer 68 and a receiving amplifier 66. Here, the analog signal is converted to a digital signal and is input to the DTE interface 58. In the DTE interface 58, a serial digital signal is converted to a parallel digital signal, which is input to the call side microcomputer 26. This results in the establishment of full duplex communication between the call side microcomputer 26 and the response side computer system 70.

Figure 28:
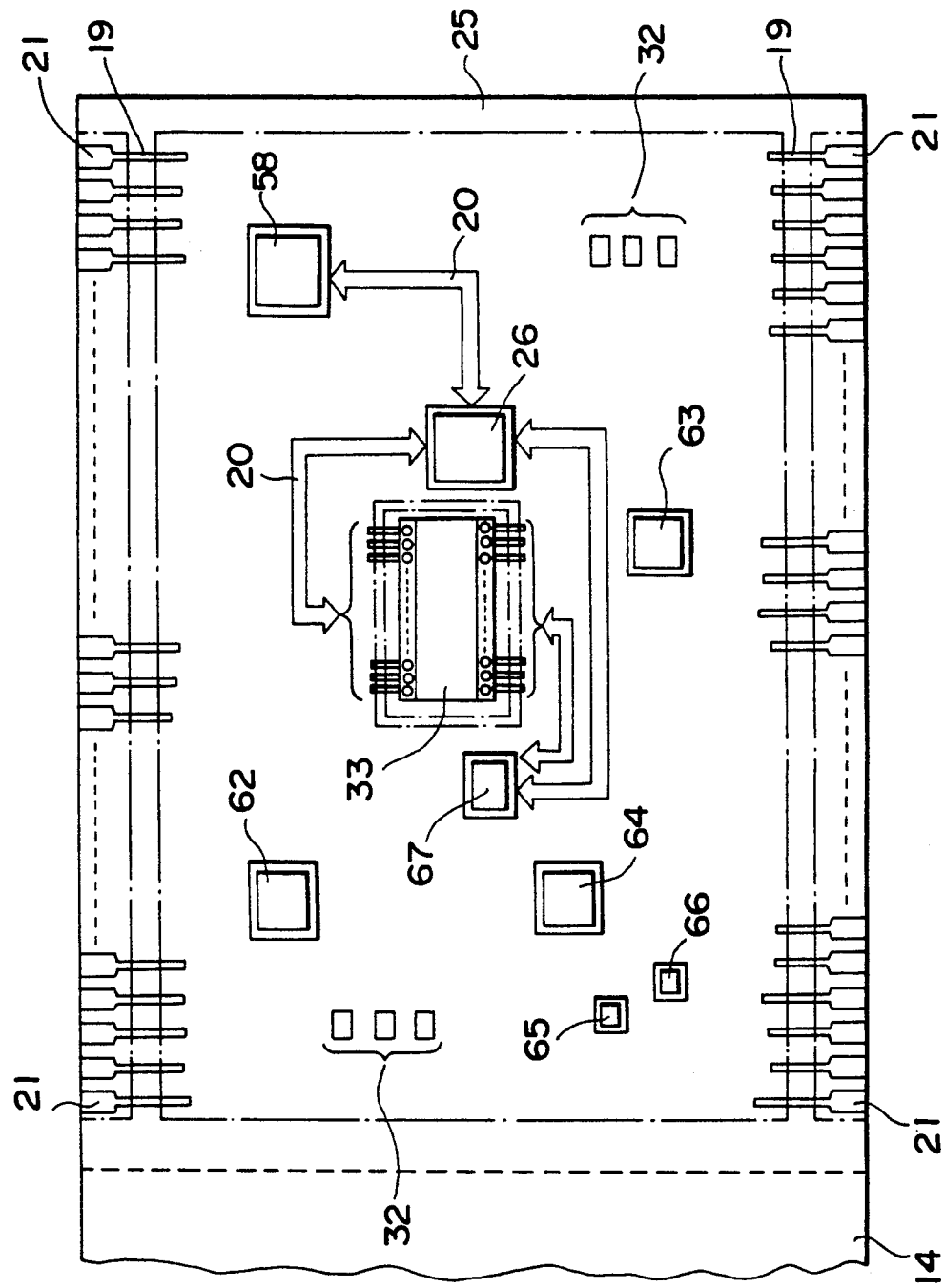

FIG. 28 is a plan drawing of the integrated circuit substrate 25. The MODEM shown in FIG. 25 can be realized using this integrated circuit substrate. The reference numbers used for the circuit elements mounted on the integrated circuit substrate 25 are the same as those used in FIG. 25. To avoid confusion, the conductive paths which connect the circuit elements have been omitted from the drawing, but one part of the conductive paths is shown as a bus line 20.

As shown in FIG. 28, a plurality of securing pads 21 for securing the external lead terminals (omitted from the drawings) is formed on both peripheral end sections in opposition of the integrated circuit substrate 25. The conductive paths 19 are formed connecting to the securing pads 21. The microcomputer 26, the DTE interface 58, the first and second modulator-demodulator circuits 62, 63, the DTMF generator 64, the control switch 67 which controls the EPROM element 38, and the chip parts 32 such as condensers and the like, are secured to the integrated circuit substrate 25 without using the socket, and the socket 33 for the EPROM element which is positioned adjacent to the microcomputer 26 and feeds data to the microcomputer 26 is also secured to the integrated circuit substrate 25. These elements are interconnected by the bus line 20 constituted of a specific conductive path 19 and function as the above-mentioned MODEM. The region enclosed by the dashed line is the region which is secured to the casing 41 by the adhesive sheet.

The hybrid integrated circuit device used for the MODEM described above can easily be modified to satisfy the requirements of the intended user, such as OEM, in-house sales, and the like. Specifically, when the design of a hybrid integrated circuit device is based on a specific customer's specifications, it does not often meet the specifications of other customers and the design of the hybrid integrated circuit device itself must be revised. However, with an embodiment in which an EPROM element is installed on an integrated circuit substrate through a socket, the installation and removal of the EPROM element is easily accomplished. It therefore becomes possible for the user to satisfy a wide variety of specifications by simply selecting and mounting the EPROM. Also, it is possible to satisfy a wide variety of user specifications in the same manner with an embodiment which uses the EPROM chip because the convenience of erasure and rewriting of the data on the EPROM chip is provided.

In the present embodiment, as shown in the above detailed explanation, first, the through-hole or notch is provided in a specified position on one of the integrated circuit substrates and the EPROM is connected to the conductive path on the other integrated circuit substrate through this part. This provides the advantage that the mounting position of the EPROM can be optionally selected. Because of this, it is possible to connect the EPROM and the microcomputer with a high degree of efficiency, considering electrical connections to the built-in microcomputer. In further detail, the microcomputer which has the closest relationship with the EPROM can be positioned adjacent to the EPROM. By this measure, it is possible to provide a layout with the data bus of minimum length or simplest design, and loss of mounting density caused by the routing of the data bus can be minimized.

Second, because the EPROM element is positioned in the through-hole or the notch on one of integrated circuit substrate, there is the advantage of dealing with a small, integrated hybrid IC device even when using a molded-type EPROM element which is commercially available on the market. When the EPROM chip is used, an even smaller hybrid integrated circuit device can be provided. Furthermore, because two integrated circuit substrates are used, the mounting density is improved, and the print board which is necessary for a conventional device can be eliminated. Therefore, a hybrid integrated circuit device with a built-in, detachable, and compact EPROM element can be provided.

Third, by using a metal substrate as the integrated circuit substrate the heat dissipation effect is vastly improved in comparison with a printed board, contributing to a further improvement in mounting density. Since a metal foil can be used for the conductive paths, the resistance value of the conductive path 3 can be considerably reduced in comparison with a conductive path where conductive paste is used. This provides more mounted circuits than with a printed board.

Fourth, various types of commercially available EPROM elements can be used as the EPROM, giving the advantage of being able to mount the EPROM on the hybrid integrated circuit device with extreme ease. Further, by making the shape of the through-hole or notch formed in one of the integrated circuit substrates the same as the external shape of the EPROM element, the EPROM element can be embedded in the hybrid integrated circuit device to give a simple shape, resulting in a hybrid integrated circuit device with a built-in EPROM with superior handling capabilities and reliability.

Fifth, because the microcomputer and the peripheral circuit elements connected to the EPROM are incorporated in a die- or chip-form into the sealed space formed by the casing and two integrated circuit substrates, the area occupied is small in comparison with that of a resin molded type such as a conventional printed board. This gives the advantage of a considerable improvement in mounting density.

Sixth, by having the peripheral ends of the casing and of the integrated circuit substrate essentially correspond, almost the entire surface of the integrated circuit substrate can be utilized as the sealed space so that an extremely compact hybrid integrated circuit device can be attained along with improved mounting density.

Seventh, when a socket is used, the EPROM element is detachable, giving the advantage of free interchangeability as well as erasure and rewriting capabilities for the EPROM element.

Eighth, because the upper surfaces of one of the integrated circuit substrates and the EPROM element correspond, the advantage of a hybrid integrated circuit device with a level upper surface can be obtained. In addition, provision of the seal material makes it possible to shield the integrated circuit substrate from light. This also gives the advantage of being able to seal the cracks between the EPROM and the casing.

Ninth, because the external lead terminal can be led out of one side or out of both sides in opposition of the two integrated circuit substrates, a hybrid integrated circuit device with an extremely large number of pins can be obtained.

A second embodiment of the present invention will now be explained with reference to FIG. 29 to FIG. 31. In the first embodiment, which was explained previously, a through-hole or notch is formed in one of the integrated circuit substrates to accommodate the EPROM, but in the second embodiment, a space is formed in the casing 41 for the EPROM element. Accordingly, in the present embodiment a punch press process for forming the through-hole or the notch in the integrated circuit substrate can be omitted.

Figure 29:
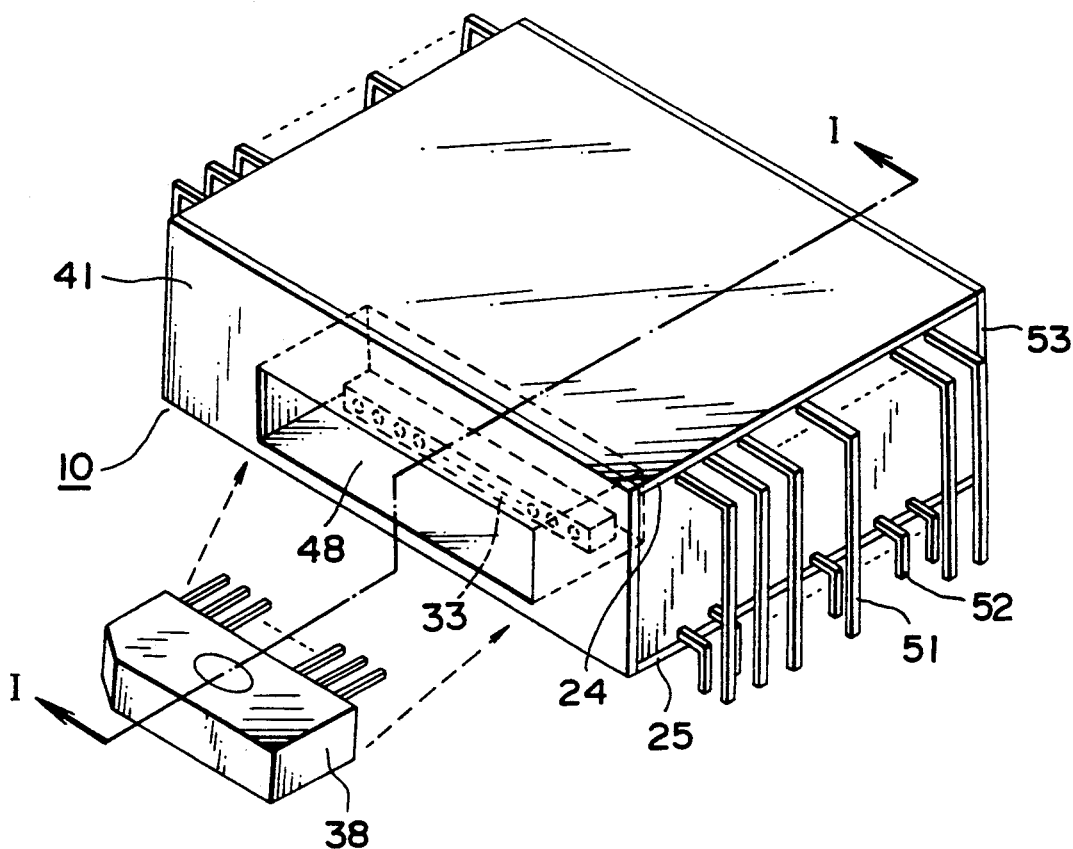
FIG. 29 is a perspective view of a second embodiment of the present invention.

FIG. 29 is a perspective view of the hybrid integrated circuit device 10 especially suited for use with a SIP-type EPROM element. With the exception of the fact that there is no through-hole formed, this embodiment comprising: the pair of integrated circuit substrates 24, 25 which has the same structure as the previous embodiment; the plurality of external lead terminals 51, 52, each soldered to pads (omitted from the drawings) of the integrated circuit substrates 24, 25; the SIP-type EPROM element 38 (hereinafter referred to simply as the EPROM element); the casing 41, integrally formed with the two integrated circuit substrates 24, 25 which are separated from each other; and the covering body 53. The casing 41 shown in FIG. 9 or FIG. 10 is used in the present embodiment.

Figure 30:
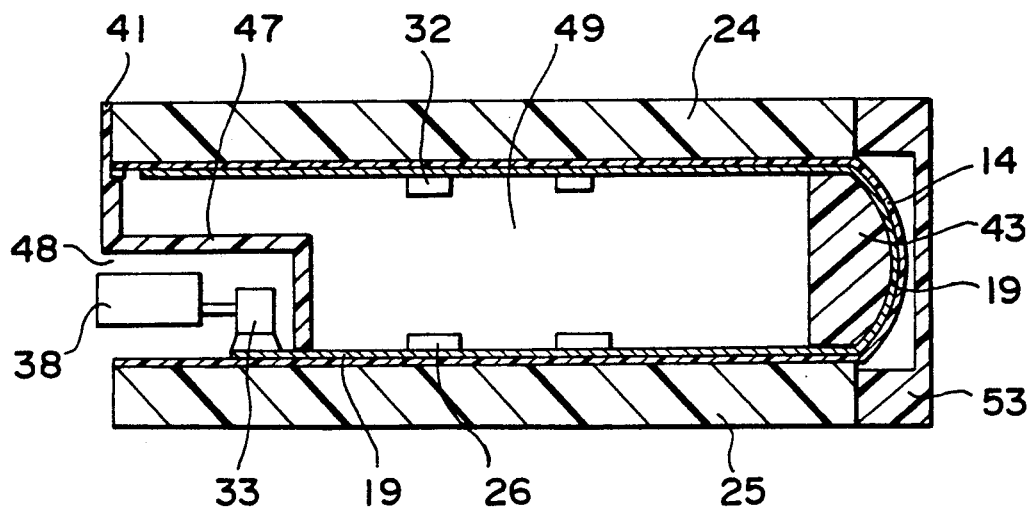
FIG. 30 is a sectional drawing viewed along the section I—I in FIG. 29.

As illustrated in FIG. 30, which is a sectional drawing viewed along the section I—I in FIG. 29, the integrated circuit substrates 24, 25, which are mechanically linked by the flexible, insulating resin layer 14, are bonded to the upper and lower surfaces of the frame-shaped casing 41, using an adhesive sheet or the like. Within the sealed space 49 formed in this manner, the microcomputer 26 and the peripheral circuit elements 32, with the exception of the EPROM element 38, are secured to the integrated circuit substrates 24, 25 by means of a plastic material such as solder or silver paste or the like. On the other hand, the socket 33 of the EPROM element 38 is secured to the integrated circuit substrate 25 within the space 48 externally exposed by means of the stepped section 47 or the bent section 46. The size of the space 48 is designed to be almost equivalent to that of the EPROM element 38. After the integrated circuit substrates 24, 25 and the casing 41 are fabricated to form an integrated structure, the exposed insulating resin layer 14 of linking section is sealed by the covering body 53 formed from the same material as the casing 41.

In the present embodiment there is no particular need for any means to shield or seal the ultraviolet-light-transmitting member 40 provided on the side surface of the EPROM element 38, because the EPROM element 38 almost touches the side surface of the space 48 into which the EPROM element 38 is inserted, and because when the hybrid integrated circuit device 10 is fabricated as usual, there is very little worry about soiling because the insertion space 48 of the EPROM element 38 opens in the lateral direction. Accordingly, in the present embodiment the erasure of data on the EPROM 38 simply requires that the EPROM 38 be removed from the socket 33 and exposed to ultraviolet light. Rewriting is performed using a normal ROM writer, after the EPROM 38 is removed from the socket 33.

The hybrid integrated circuit device 10 of the present embodiment with the configuration outlined above, in addition to providing the same effect as the first embodiment, has the advantage that the punch press process for forming the through-hole or the notch in the integrated circuit substrate 24 can be omitted. The integrated circuit substrate 24 also has superior heat dissipation characteristics because it has no through-hole or notch. There is also the advantage that an extremely thin hybrid integrated circuit device 10 can be provided because it is constructed so as to insert a thin, SIP-type EPROM element 38 from the side.

Figure 31:
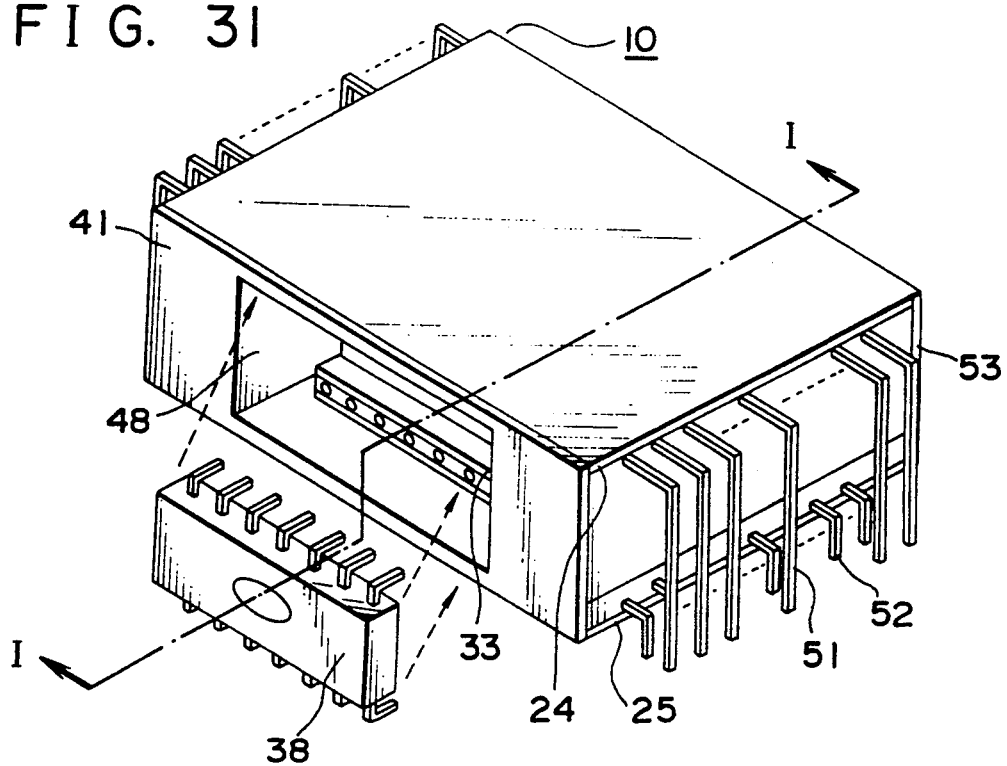
FIG. 31 is a perspective view of a modification of the second embodiment of the present invention

FIG. 31 shows a modification of the second embodiment. The hybrid integrated circuit device 10 comprises: the pair of integrated circuit substrates 24, 25 which have almost the same structure as those of the second embodiment; the plurality of external lead terminals 51, 52, each soldered to a pad (omitted from the drawing) on the integrated circuit substrates 24, 25; the casing 41, integrally formed with the two integrated circuit substrates 24, 25 which are separated from each other; the DIP-type EPROM element 38 inserted into the insertion hole 50 in the side of the casing 41; the socket 33 into which the lead terminals on one side of the DIP-type EPROM element 38 are inserted; and the covering body 53. The socket 33 into which the lead terminals on the other side of the DIP-type EPROM element 38 are inserted and which is secured to the integrated circuit substrate 24 is not shown in the drawing.

In this modification of the present embodiment the data from the lead terminals on one side of the DIP-type EPROM element 38 or the address signal fed to the lead terminals on one side of the DIP-type EPROM is fed to the microcomputer via the integrated circuit substrate 24 to which the microcomputer is not secured, or is fed from the microcomputer.

A third embodiment of the present invention will now be explained with reference to FIG. 32 to FIG. 37.

Figure 32:
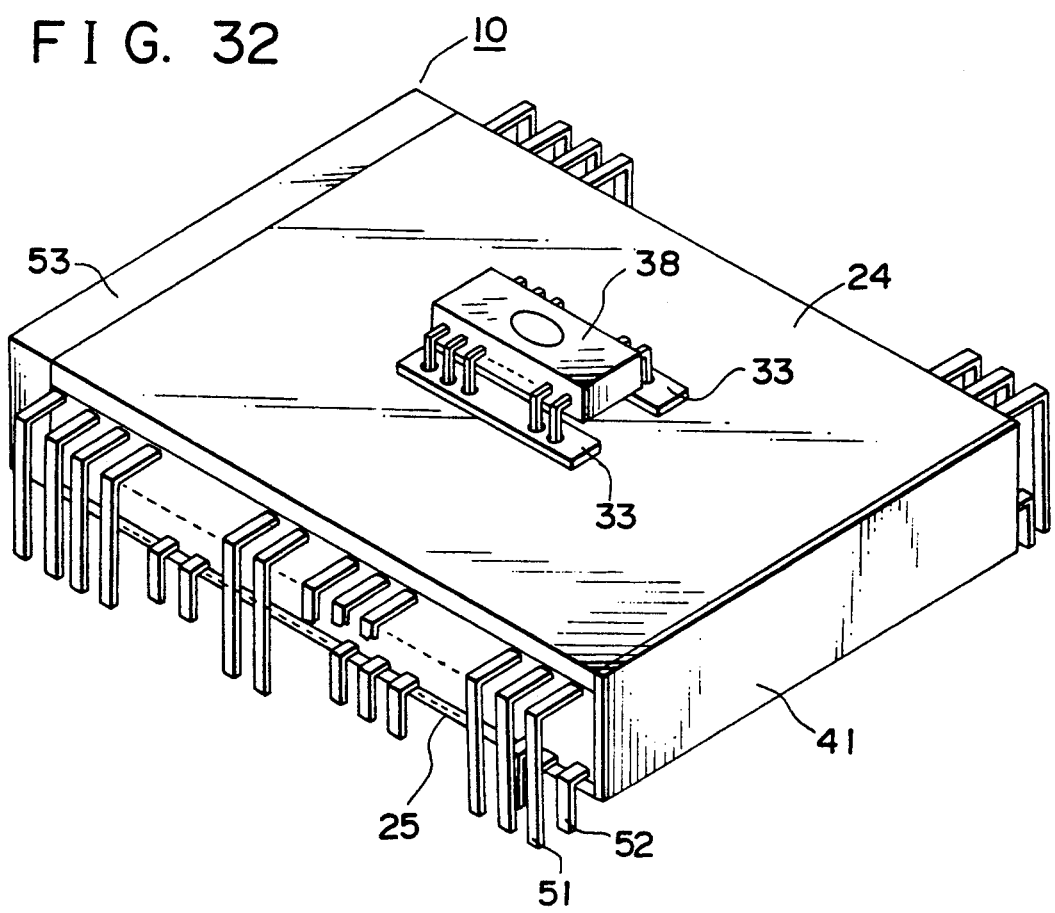
FIG. 32 is a perspective view of a third embodiment of the present invention.

FIG. 32 is a perspective view of the hybrid integrated circuit device 10, which comprises the pair of integrated circuit substrates 24, 25 which have almost the same structure as in the previous embodiments; the external lead terminals 51, 52, each soldered to a pad (omitted from the drawing) of the integrated circuit substrates 24, 25; the pair of sockets 33 which are hermetically sealed to the integrated circuit substrate 24; the DIP-type EPROM element 38 which is inserted into the sockets 33; the casing 41, integrally formed with the integrated circuit substrates 24, 25 which are separated from each other; and the covering body 53. The integrated circuit substrate 24 (not shown in the drawing) used in this embodiment is formed with two elongated through holes 15. The simple form shown in FIG. 11 is used for the casing 41.

Figure 33:
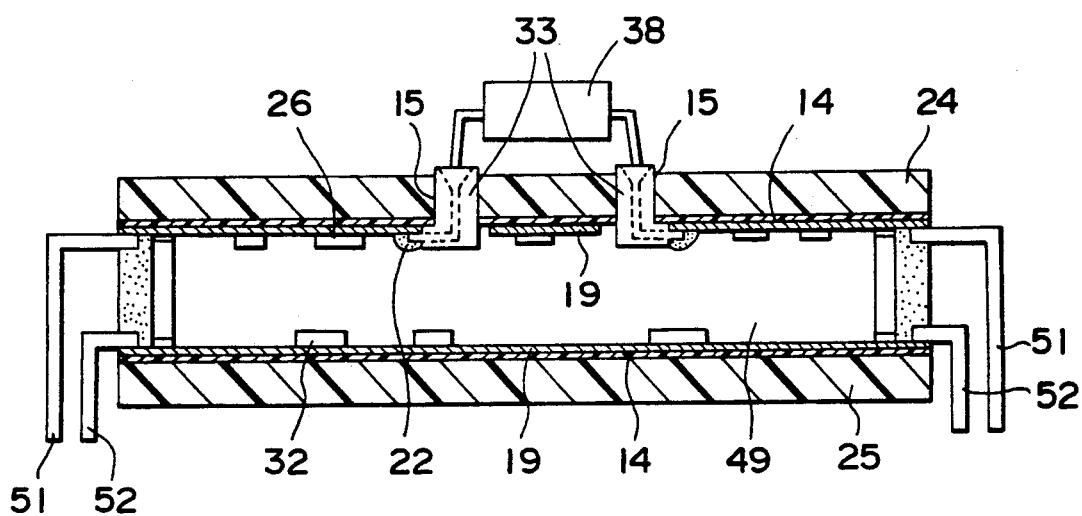
FIG. 33 is a sectional drawing viewed along the section I—I in FIG. 32.

As illustrated in FIG. 33, which is a sectional drawing viewed along the section I—I in FIG. 32, the integrated circuit substrates 24, 25 are bonded to the casing 41, using an adhesive sheet or the like. The chip-type microcomputer 26 and the peripheral circuit elements 32, with the exception of the EPROM element 38, are secured to the integrated circuit substrates 24, 25 within the sealed space 49 formed by the integrated circuit substrates 24, 25 and the casing 41.

The two elongated through-holes 15 in the integrated circuit substrate 24 are formed adjacent to the microcomputer 26, and the two separated sockets 33 are hermetically sealed in the respective through-holes 15. A quantity of solder 23 is used to connect the electrodes to a specific conductive path 19 which terminates at the periphery. The EPROM element 38, which is inserted into the sockets 33, and the microcomputer 26 are thus interconnected via the sockets 33 and the specified conductive path 19 through an extremely short distance.

Figure 34:
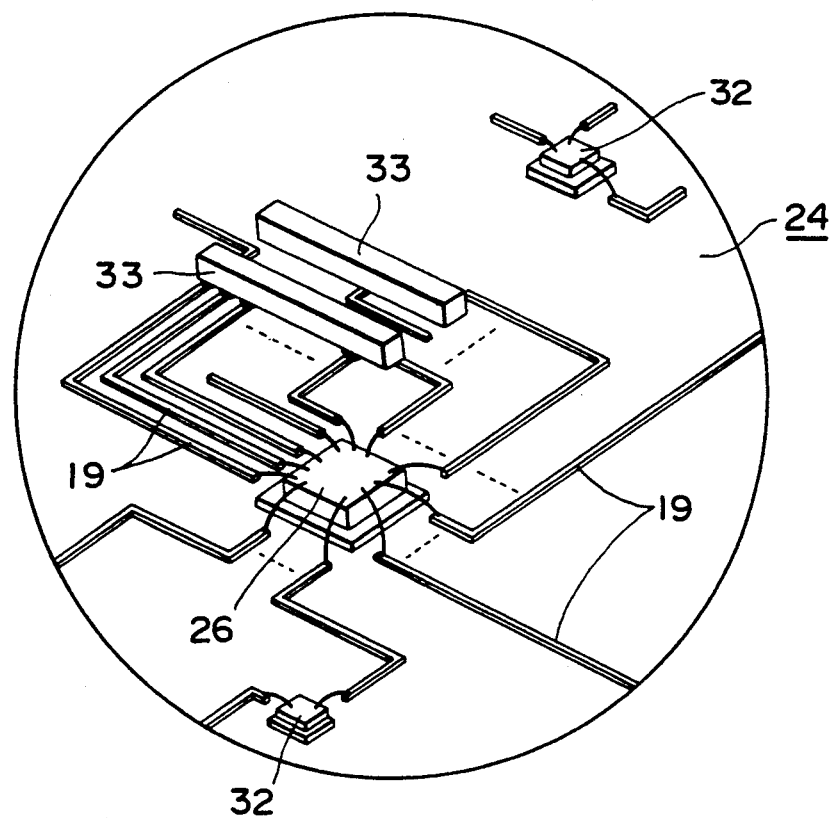
FIG. 34 is an enlarged drawing showing the area around the EPROM on the integrated circuit substrate used in the third embodiment.

The positional relationship of the EPROM element 38 and the microcomputer 26 will be explained in order to explain the features of the present embodiment, although a part of the explanation is repeated. FIG. 34 is an enlarged view of part of the integrated circuit substrate 24 showing the integrated circuit substrate 24 on which are formed a plurality of conductive paths 19; the chip-type microcomputer 26 and the peripheral circuit elements 32 which are die-bonded in the integrated circuit substrate 24; and the two sockets 33 into which the EPROM element 38 is inserted. The conductive paths 19 terminate close to the microcomputer 26, the sockets 33, and the peripheral circuit elements 32. The electrodes of the microcomputer 26 and the peripheral circuit elements 32 are connected to the respective terminal sections of the conductive paths 19 by wire bonding. Also, to the opposite terminal end sections of the conductive paths 19 connected to the electrode of the microcomputer 26 are soldered the respective electrodes of the sockets 33. These conductive paths 19 are formed between the two sockets 33, and the microcomputer 26 and the peripheral circuit elements 32 are positioned between the two sockets 33 (not shown on the drawings). For this reason, this embodiment has the advantage that the mounting area of the integrated circuit substrates 24, 25 can be fully utilized.

Again referring to FIG. 32, as shown in the drawing, with the hybrid integrated circuit device 10 of this embodiment, the light-shielding seal material 56 must be attached to the upper surface of the EPROM element 38, because the EPROM element 38 is completely exposed. Accordingly, with the present embodiment, data is erased from the EPROM element 38 by peeling off the light-shielding seal material 56 and directing UV light onto the EPROM element 38, or by removing the EPROM element 38 from the socket 33 and subjecting it to UV light. Rewriting in the EPROM element 38 is performed by removing it from the socket 33 and using an ordinary ROM writer.

The hybrid integrated circuit device 10 of the present embodiment with the configuration outlined above, in addition to providing the same effect as the first embodiment has the advantage that it is extremely easy to write data onto the EPROM element 38, and, as previously explained, the mounting area of the integrated circuit substrates 24, 25 can be effectively utilized.

Figure 35:
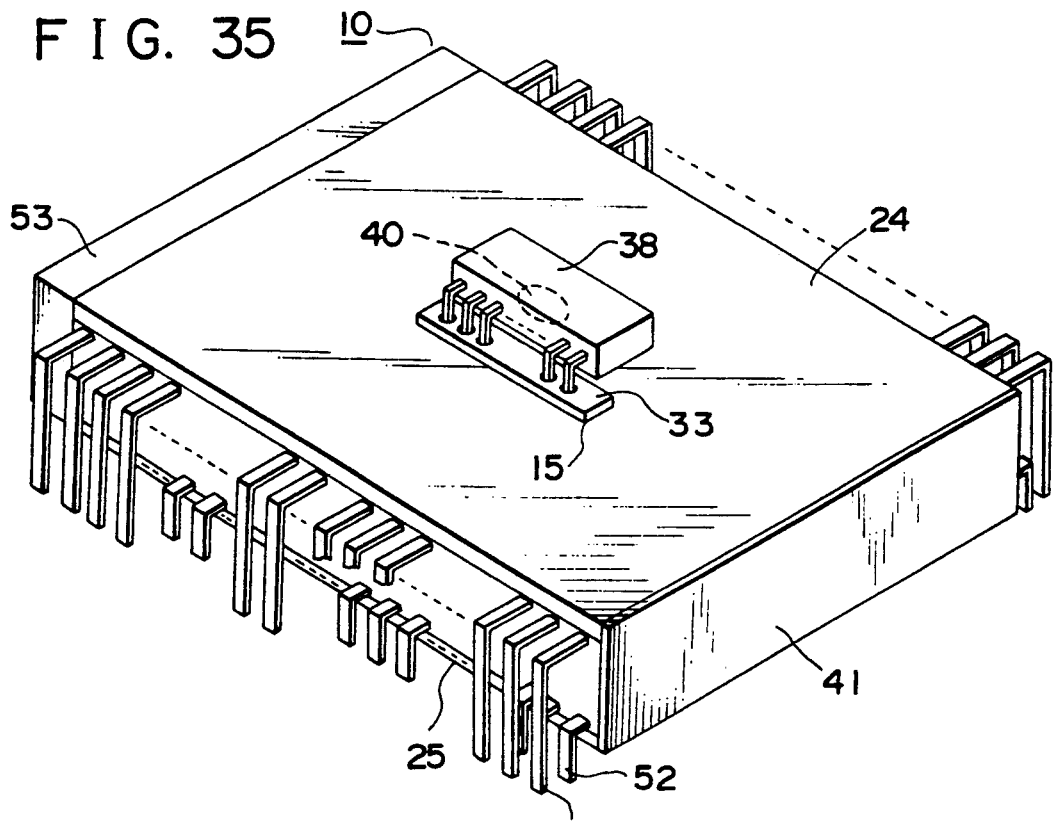
FIG. 35 is a perspective view showing a modification to the third embodiment of the present invention.

A SIP-type, LCC-type, or PLCC-type of EPROM element can be used as the EPROM element 38 in this embodiment of the present invention. FIG. 35 shows a modification of this embodiment in which a SIP-type of EPROM element is used. In the modification using the SIP-type of EPROM element, the only one socket 33 is required, and because the ultraviolet light transmitting member 40 of the EPROM element 38 shown by the interrupted line in FIG. 35 is formed facing to the integrated circuit substrate 24, the light-shielding seal material can be omitted. Otherwise, this modification is exactly the same as the previously described embodiment, and the identical members carry the same reference numbers, so further explanation will be omitted.

A further modification of the third embodiment of the present invention will now be explained with reference to FIG. 36 and FIG. 37.

Figure 36:
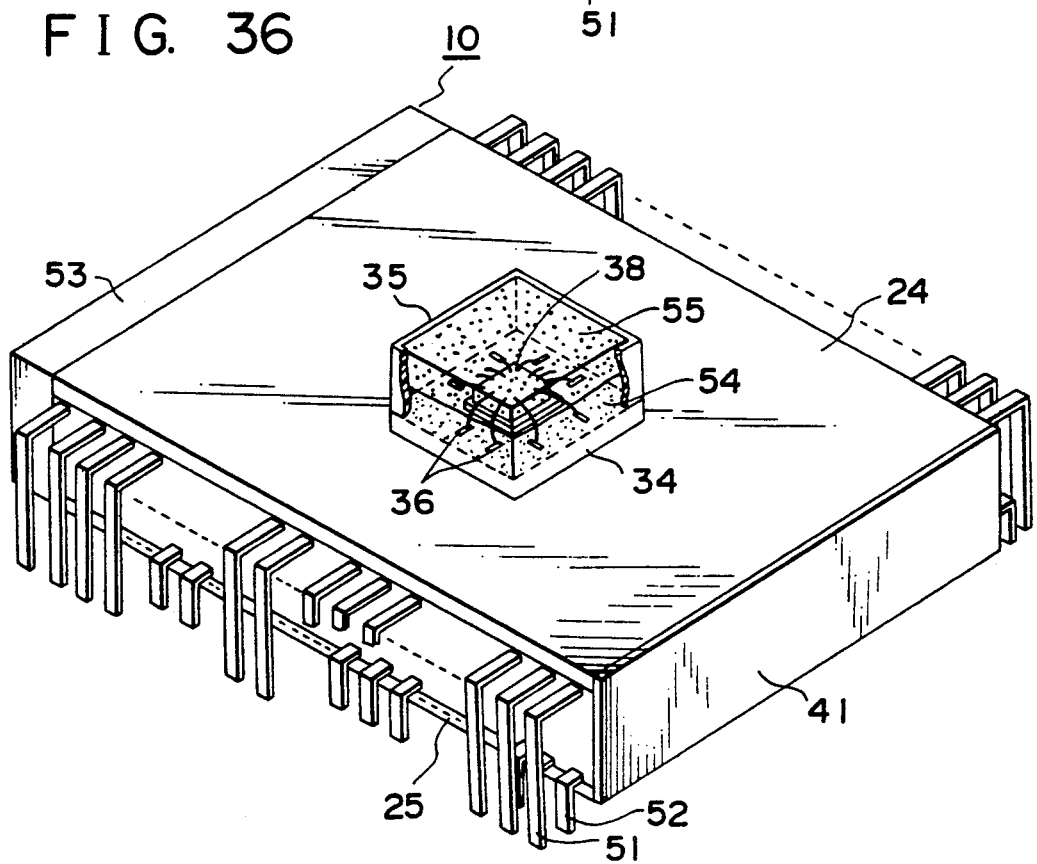
FIG. 36 is a perspective view showing another modification to the third embodiment of the present invention.

Referring to FIG. 36 which is a perspective view of this modification, the hybrid integrated circuit device 10 which uses an EPROM chip as the EPROM, comprises the pair of integrated circuit substrates 24, 25 which have almost the same structure as those of the embodiment explained hereinbefore; a plurality of external lead terminals 51, 52, each soldered to a pad (omitted from the drawing) of the integrated circuit substrates 24, 25; a header mounting member 34 hermetically sealed in the integrated circuit substrate 24; the casing 41, as shown in FIG. 11, integrally formed with the two integrated circuit substrates 24, 25 which are separated from each other by a specified distance; and the covering body 53. The drawing shows one part of the header mounting body 34 in section to illustrate its internal construction. The EPROM chip 38 is secured to a header (to which no reference number has been attached in the drawing) formed from a metal layer of, for example, copper foil, gold, silver, or the like, on the bottom of the space 37 enclosed by an auxiliary frame 35 of the header mounting body 34. The electrode of the EPROM chip 38 is connected by aluminum wire or the like to one end of a lead-out lead 36. The first and second resin layers 54, 55 are formed in the space 37 enclosed by the auxiliary frame 35 of the header mounting body 34.

Figure 37:
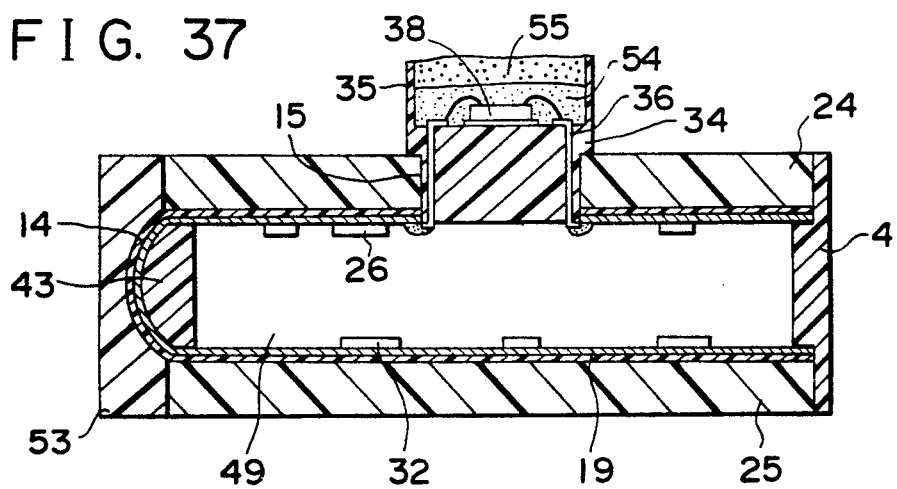
FIG. 37 is a sectional drawing viewed along the section I—I in FIG. 36.

As illustrated in FIG. 37, which is a sectional drawing viewed along the section I—I in FIG. 36, the integrated circuit substrates 24, 25 are bonded to the casing 41, using an adhesive sheet or the like. The chip-type microcomputer 26 and the peripheral circuit elements 32, with the exception of the EPROM element 38, are secured to the integrated circuit substrates 24, 25 at a position within the sealed space 49 formed by the integrated circuit substrates 24, 25 and the casing 41.

The header mounting body 34, in which the lead-out lead 36 is embedded, is formed in a convex shape from an insulating body of ceramic, glass-epoxy, or insulating resin, or the like, and is hermetically sealed in the preformed through-hole 15 positioned adjacent to the microcomputer 26 in the integrated circuit substrate 24. The lead-out lead 36 is soldered to the terminal of a specific conductive path 19 of the integrated circuit substrate 24. The EPROM element 38 which are mounted on the header mounting body 34 and the microcomputer 26, are interconnected via the lead-out lead 36 and the specified conductive path 19 through an extremely short distance.

As previously explained, the ultraviolet-light-transmitting resin 54, through which UV-light can be passed to erase the data on the EPROM chip 38, is used in the first resin layer. The first resin layer 54 completely covers the bonding wire which connects the EPROM chip 38 and its electrode to the conductive path 19. A non-ultraviolet-transmitting resin 55 is used as the second resin layer to act as a UV shield for preventing erroneous erasure of the data on the EPROM chip 38 and is filled to a point almost corresponding to the upper surface of the auxiliary frame 35.

In the present embodiment, the size of the header mounting body 34 can be reduced to correspond with the size of the EPROM 38, and, in the same manner as in the previously explained embodiment, there is the advantage that the mounting area of the integrated circuit substrates 24, 25 can be fully utilized. There is also the advantage that, in spite of using the EPROM chip 38, erasure and writing of data in the EPROM chip 38 can be easily performed, because of mounting the EPROM chip 38 on the peripheral end of the integrated circuit substrate 24.

A fourth embodiment of the present invention will be explained with reference to FIG. 38 to FIG. 41.

Figure 7:
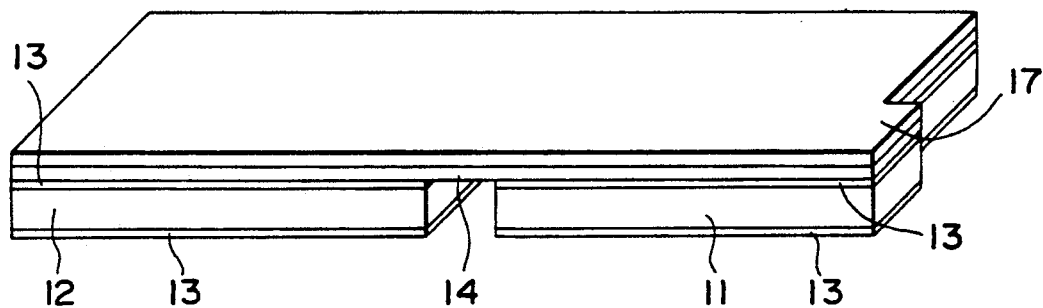
Figure 38:
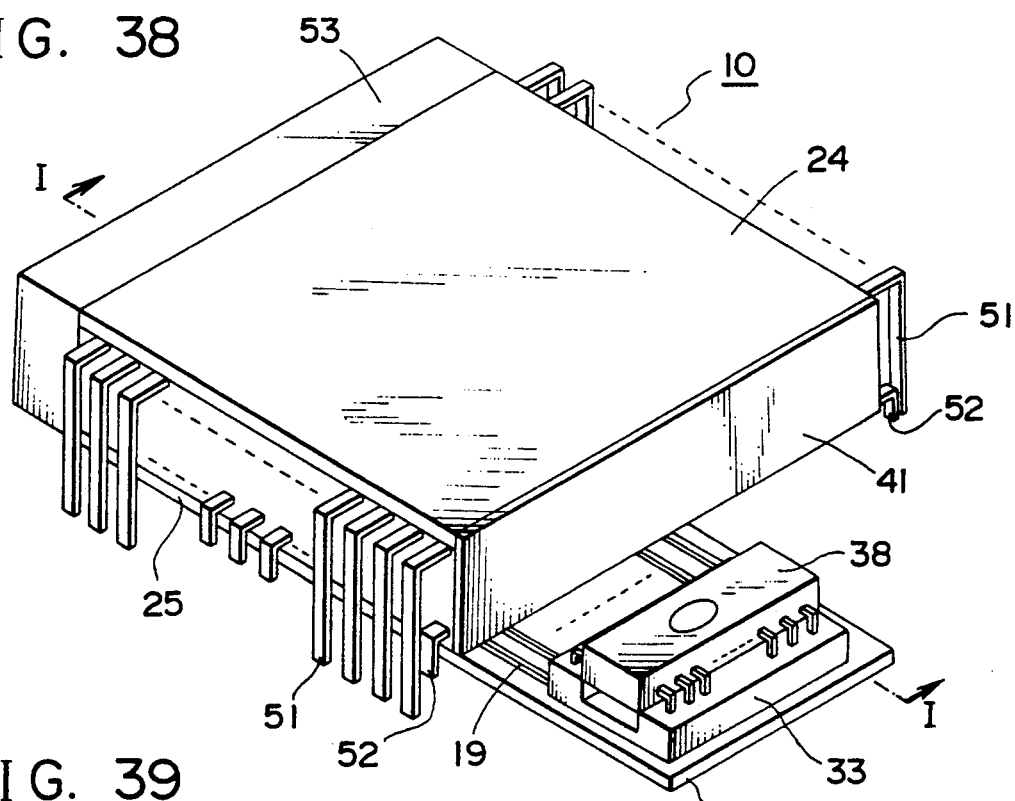
FIG. 38 is a perspective view showing a fourth embodiment of the present invention.

FIG. 38 is a perspective view of the hybrid integrated circuit device 10, which comprises the pair of integrated circuit substrates 24, 25 shown in FIG. 7; a plurality of external lead terminals 51, 52, each soldered to a pad (omitted from the drawing) on the integrated circuit substrates 24, 25; the socket 33 secured to the one integrated circuit substrate 25; the DIP-type EPROM element 38 which is inserted into the socket 33; the casing 41, integrally formed with the integrated circuit substrates 24, 25 which are separated from each other by a specified distance; and the covering body 53.

Figure 39:
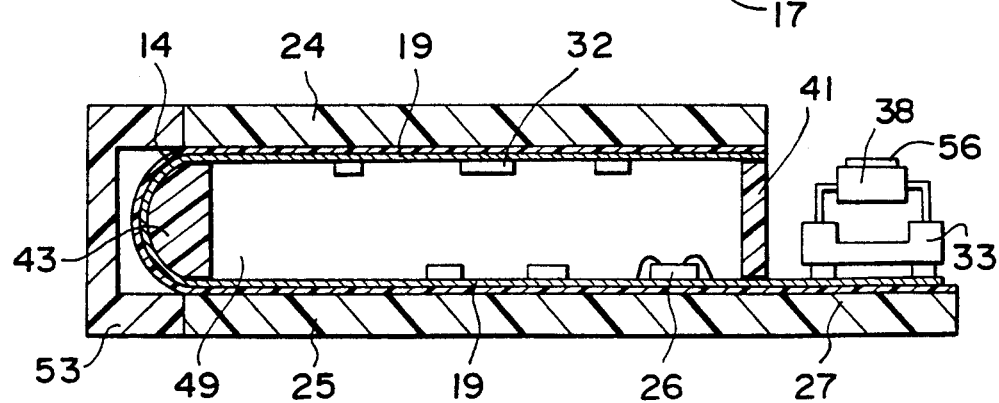
FIG. 39 is a sectional drawing viewed along the section I—I in FIG. 38.

As illustrated in FIG. 39, which is a sectional drawing viewed along the section I—I in FIG. 38, the integrated circuit substrates 24, 25 are bonded to the casing 41 of the shape shown in FIG. 11. The chip-type microcomputer 26 and the peripheral circuit elements 32, with the exception of the EPROM element 38, are secured to the integrated circuit substrates 24, 25 at a position within the sealed space 49 formed by the integrated circuit substrates 24, 25 and the casing 41. The EPROM element 38 and its socket 33 are positioned on a projecting section 17 of the integrated circuit substrate 25.

This embodiment of the present invention, in addition to providing the same effect as the previous embodiments has the advantage that, because the EPROM element 35 is positioned o the projection 17 of the integrated circuit substrate 25, the mounting of the elements can be maximized in the sealed space 49 formed by the integrated circuit substrates 24, 25 and the casing 41.

Figure 40:
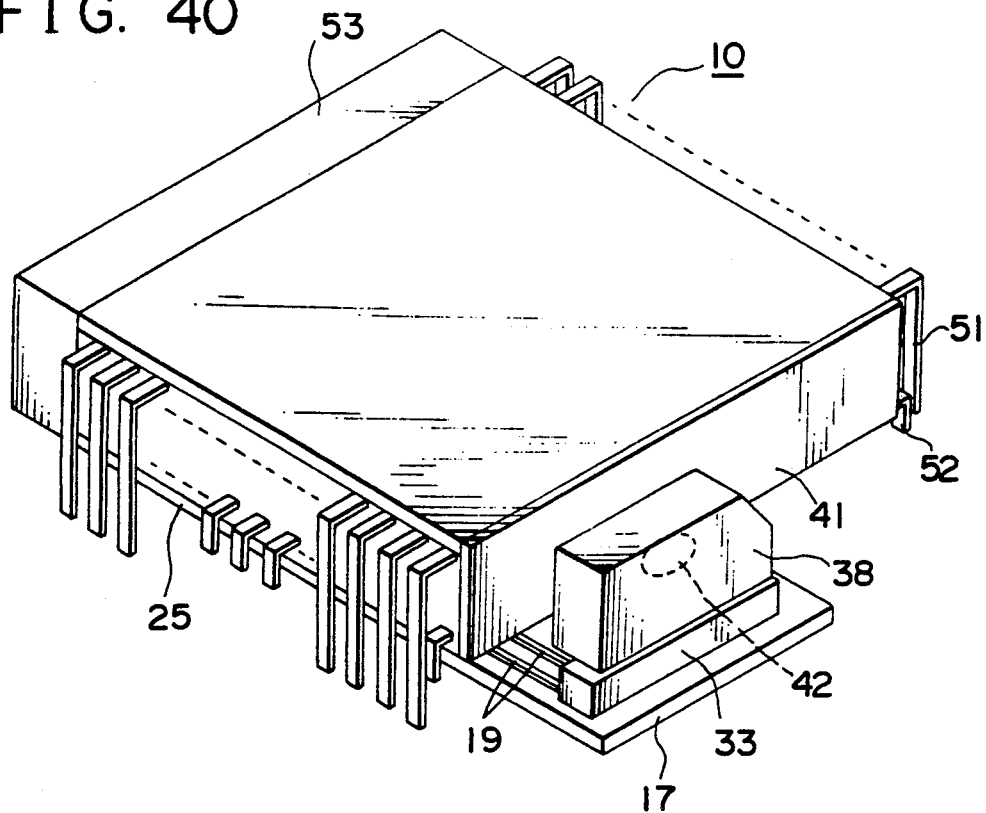
FIG. 40 and FIG. 41 are perspective views showing different modifications to the fourth embodiment of the present invention.
Figure 41:
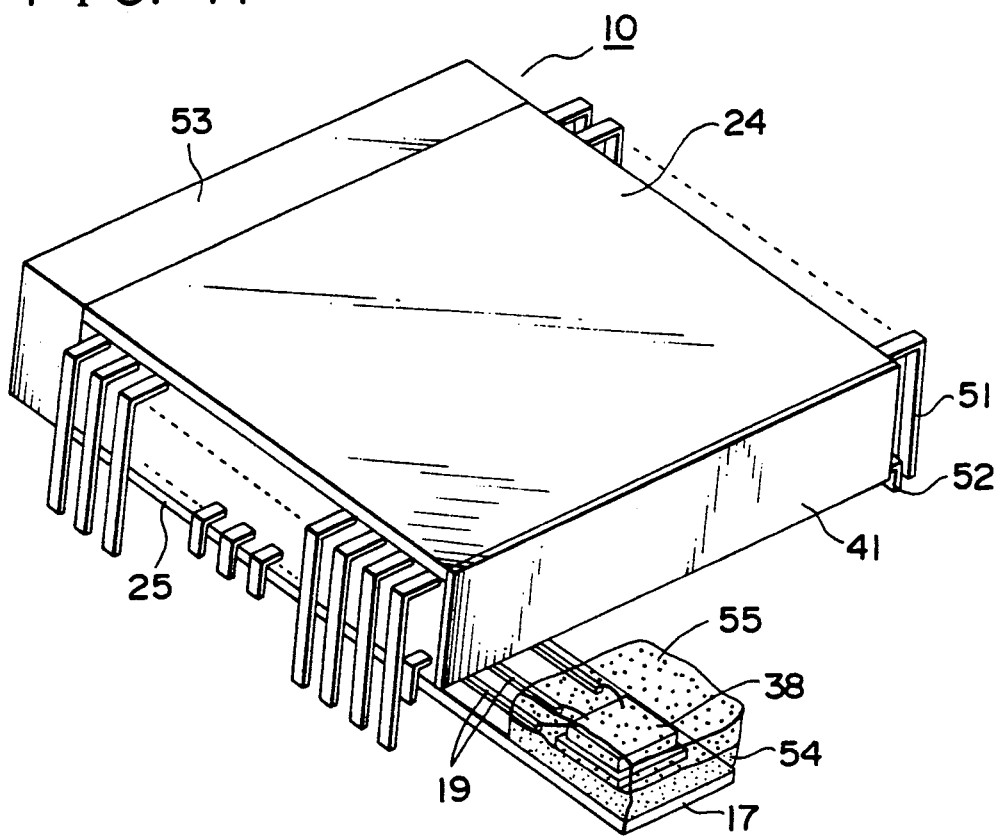

It is also possible to modify the present embodiment to use a SIP-type EPROM element or an EPROM chip. FIG. 40 and FIG. 41 are perspective views showing these types of modifications. Because the members of these modifications carry the same reference numbers as members which have previously been explained, further explanation will be omitted.

Obviously, numerous modifications and variations of the present invention are possible in light of the above teachings. It is therefore to be understood that within the scope of the appended claims, the invention may be practiced otherwise than as specifically described herein.

What is claimed is:

1. A hybrid integrated circuit device comprising:

a pair of integrated circuit substrates each having a main surface, and conductive paths formed on said main surfaces, one of said substrates being provided with an insertion hole;

a non-volatile memory sealed in resin, a socket mounted on the other one of said substrates in line with said insertion hole, and a microcomputer and its peripheral circuit elements, said socket, said microcomputer and said peripheral circuit elements being connected with said conductive paths and said non-volatile memory being inserted in said socket and being connected to said conductive paths via said socket; and a casing having upper and lower internal surfaces, with each of said integrated circuit substrates being secured to a respective one of said upper and lower internal surfaces so that said main surfaces of said substrates are spaced apart from, and face, one another;

wherein said substrates and said casing form a sealed space in which said microcomputer and its circuit elements are disposed, said microcomputer and its peripheral circuit elements are mounted on said main surfaces of said substrates, and said main surface of each said substrate carries at least one of said microcomputer and a said peripheral circuit element.

2. The hybrid integrated circuit device of claim 1, wherein the integrated circuit substrate is a metal substrate for which the surface has been subjected to an insulating treatment, and the conductive path is formed by applying a copper foil.

3. The hybrid integrated circuit device of claim 1, wherein the microcomputer is die bonded onto the conductive path.

4. The hybrid integrated circuit device of claim 1, wherein chip parts comprising a chip resistor and a chip condenser are used as the peripheral circuit elements.

5. The hybrid integrated circuit device of claim 1, wherein: the insertion hole for the non-volatile memory formed in one of the pair of integrated circuit substrates is formed in essentially the same shape as the external form of the non-volatile memory; and the upper surface of the non-volatile memory and the upper surface of the integrated circuit substrate in which the insertion hole is formed essentially correspond.

6. The hybrid integrated circuit device of claim 1, wherein the upper surface of the non-volatile memory is covered with a light-shielding seal material which extends around the periphery of the insertion hole of the casing.

7. The hybrid integrated circuit device of claim 1, wherein the non-volatile memory is a dual-in-line type, an LCC type, or a PLCC type of non-volatile memory.

8. The hybrid integrated circuit device of claim 1, wherein the non-volatile memory is a single in-line type of non-volatile memory.

9. A hybrid integrated circuit device comprising:
a pair of integrated circuit substrates each having a main surface and a peripheral edge, and conductive paths formed on said main surfaces;
a non-volatile memory sealed in resin, a socket mounted on one of said substrates, and a microcomputer and its peripheral circuit elements, said socket, said microcomputer and said peripheral circuit elements being connected with said conductive paths and said non-volatile memory being inserted in said socket and being connected to said conductive paths via said socket; and
a casing having upper and lower internal surfaces, with each of said integrated circuit substrates being secured along its peripheral edge to a respective one of said upper and lower internal surfaces so that said main surfaces of said substrates are spaced apart from, and face, one another, said casing being provided with a cavity in which said socket is located;
wherein said substrates and said casing form a sealed space in which said microcomputer and its circuit elements are disposed, said microcomputer and its peripheral circuit elements are mounted on said main surfaces of said substrates, and said main surface of each said substrate carries at least one of said microcomputer and a said peripheral circuit element.

10. The hybrid integrated circuit device of claim 9, wherein the non-volatile memory is a dual-in-line or a single in-line type of non-volatile memory.

11. A hybrid integrated circuit device comprising:
a pair of integrated circuit substrates each having a main surface, and conductive paths formed on said main surfaces, one of said substrates being provided with a hole;
a non-volatile memory sealed in resin, a socket mounted on said main surface of one of said substrates in line with said hole, and a microcomputer and its peripheral circuit elements, said socket, said microcomputer and said peripheral circuit elements being connected with said conductive paths and said non-volatile memory being inserted in said socket and being connected to said conductive paths via said socket; and
a casing having upper and lower internal surfaces, with each of said integrated circuit substrates secured to a respective one of said upper and lower internal surfaces so that said main surfaces of said substrates are spaced apart from, and face, one another;
wherein said substrates and said casing form a sealed space in which said microcomputer and its circuit elements are disposed, said microcomputer and its peripheral circuit elements are mounted on said main surfaces of said substrates, and said main surface of each said substrate carries at least one of said microcomputer and a said peripheral circuit element, said non-volatile memory is hermetically sealed in said hole, and only said non-volatile memory projects externally from said casing.

12. The hybrid integrated circuit device of claim 1, wherein the non-volatile memory is a dual-in-line type, and LCC type, or a PLCC type of non-volatile memory, and the socket for the non-volatile memory is hermetically sealed in the hole in the integrated circuit substrate.

13. The hybrid integrated circuit device of claim 12, wherein the socket is a two-piece socket and a conductive path is formed between the two pieces of the socket in the integrated circuit substrate.

14. The hybrid integrated circuit device of claim 13, wherein the non-volatile memory is a single-in-line type of non-volatile memory, and an ultraviolet light transmitting section of the non-volatile memory for shielding the non-volatile memory from external light is positioned facing said main surface of said one substrate.

15. A hybrid integrated circuit device comprising:
a pair of integrated circuit substrates each having a main surface, and conductive paths formed on said main surfaces;
a non-volatile memory sealed in resin, a socket mounted on one of said substrate, and a microcomputer and its peripheral circuit element, said socket, said microcomputer and said peripheral circuit elements being connected with said conductive paths and said non-volatile memory being inserted in said socket and being connected to said conductive paths via said socket; and
a casing having upper and lower internal surfaces, with each of said integrated circuit substrates secured to a respective one of said upper and lower internal surfaces so that said main surfaces of said substrates are spaced apart from, and face, one another;
wherein said substrates and said casing form a sealed space in which said microcomputer and its circuit elements are disposed, said microcomputer and its peripheral circuit elements are mounted on said main surfaces of said substrates, said main surface of each said substrate carries at least one of said microcomputer and a said peripheral circuit element, said one of said substrates has a section which projects to a greater extent than the other one of said substrates, said conductive paths extend over said section, and said socket is mounted on said section and is connected to said conductive paths on said section.

16. The hybrid integrated circuit device of claim 15, wherein the non-volatile memory is a dual-in-line type of non-volatile memory, and a light-shielding seal material is provided over the surface of the non-volatile memory.

17. The hybrid integrated circuit device of claim 15, wherein the non-volatile memory is a single in-line type of non-volatile memory and the ultraviolet light transmitting section for shielding the non-volatile memory from external light is positioned adjacent to the side surface of the framework-type casing.

* * * * *